US009610762B2

(12) United States Patent
Fujimoto

(10) Patent No.: US 9,610,762 B2
(45) Date of Patent: Apr. 4, 2017

(54) BOARD PRINTING APPARATUS AND BOARD PRINTING METHOD

(71) Applicant: YAMAHA HATSUDOKI KABUSHIKI KAISHA, Shizuoka-ken (JP)

(72) Inventor: Takeshi Fujimoto, Shizuoka-ken (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 0 days.

(21) Appl. No.: 14/883,213

(22) Filed: Oct. 14, 2015

(65) Prior Publication Data

US 2016/0031204 A1 Feb. 4, 2016

Related U.S. Application Data

(62) Division of application No. 14/109,679, filed on Dec. 17, 2013.

(30) Foreign Application Priority Data

Dec. 19, 2012 (JP) ................................ 2012-277468

(51) Int. Cl.
*B41F 15/26* (2006.01)
*B41F 15/08* (2006.01)
(Continued)

(52) U.S. Cl.
CPC ............ *B41F 15/0881* (2013.01); *B41F 1/38* (2013.01); *B41F 15/26* (2013.01); *B41F 15/36* (2013.01);
(Continued)

(58) Field of Classification Search
CPC ...... B41F 15/26; B41F 15/36; B41F 15/0881; H05K 3/1216; H05K 3/1225;
(Continued)

(56) References Cited

U.S. PATENT DOCUMENTS 5,943,089 A 8/1999 Douglas
6,202,551 B1 3/2001 Murakami
(Continued)

FOREIGN PATENT DOCUMENTS

EP 1558066 A1 7/2005
JP H02-029396 A 1/1990
(Continued)

OTHER PUBLICATIONS

An Office Action; "Notice of Reason for Rejection," issued by the Japanese Patent Office on Sep. 16, 2014, which corresponds to Japanese Patent Application No. 2012-277468 and is related to U.S. Appl. No. 14/109,679, with English translation.
(Continued)

*Primary Examiner* — Blake A Tankersley
(74) *Attorney, Agent, or Firm* — Studebaker & Brackett PC

(57) ABSTRACT

A board printing apparatus includes a board working table, a first printing table, a second printing table, and a control portion controlling printing operations. The control portion is configured to perform second printing on a board held by the board working table by a large component mask of the second printing table after a first printing performed on the board held by the board working table by a small component mask of the first printing table.

3 Claims, 15 Drawing Sheets

(51) Int. Cl.

| | |
|---|---|
| ***B41F 15/36*** | (2006.01) |
| ***H05K 3/12*** | (2006.01) |
| ***H05K 3/34*** | (2006.01) |
| ***B41F 1/38*** | (2006.01) |

(52) U.S. Cl.

CPC ......... *H05K 3/1225* (2013.01); *H05K 3/3484* (2013.01); *H05K 2201/09736* (2013.01); *H05K 2203/1476* (2013.01); *H05K 2203/165* (2013.01)

(58) Field of Classification Search

CPC ......... H05K 3/1233; H05K 2203/0165; H05K 2203/1476; H05K 2201/09736; B41N 1/248; B41M 1/12; B41P 2215/50

See application file for complete search history.

(56) References Cited

U.S. PATENT DOCUMENTS

| | | | |
|---|---|---|---|
| 2010/0242755 | A1 | 9/2010 | Nagao |
| 2011/0315028 | A1 | 12/2011 | Abe et al. |
| 2012/0000380 | A1 | 1/2012 | Tanaka et al. |
| 2012/0085253 | A1 | 4/2012 | Nagao |
| 2012/0085254 | A1 | 4/2012 | Nagao |
| 2012/0090483 | A1 | 4/2012 | Willshere et al. |
| 2012/0304876 | A1 | 12/2012 | Miyake et al. |
| 2012/0304877 | A1 | 12/2012 | Yamada et al. |
| 2013/0025481 | A1* | 1/2013 | Moncavage ......... H05K 3/1225 101/126 |

FOREIGN PATENT DOCUMENTS

| | | |
|---|---|---|
| JP | 2006-066811 A | 3/2006 |
| JP | 2009-070867 A | 4/2009 |

OTHER PUBLICATIONS

The extended European search report issued by the European Patent Office on May 20, 2014, which corresponds to European Patent Application No. 13005670.8-1803 and is related to U.S. Appl. No. 14/109,679.

An Office Action issued by the Korean Patent Office on Dec. 1, 2014, which corresponds to Korean Patent Application No. 10-2013-0156981 and is related to U.S. Appl. No. 14/109,679, with English translation.

Communication pursuant to Article 94(3) EPC issued by the European Patent Office on Jun. 22, 2016, which corresponds to European Patent Application No. 13005670.8-1803 and is related to U.S. Appl. No. 14/883,213.

* cited by examiner

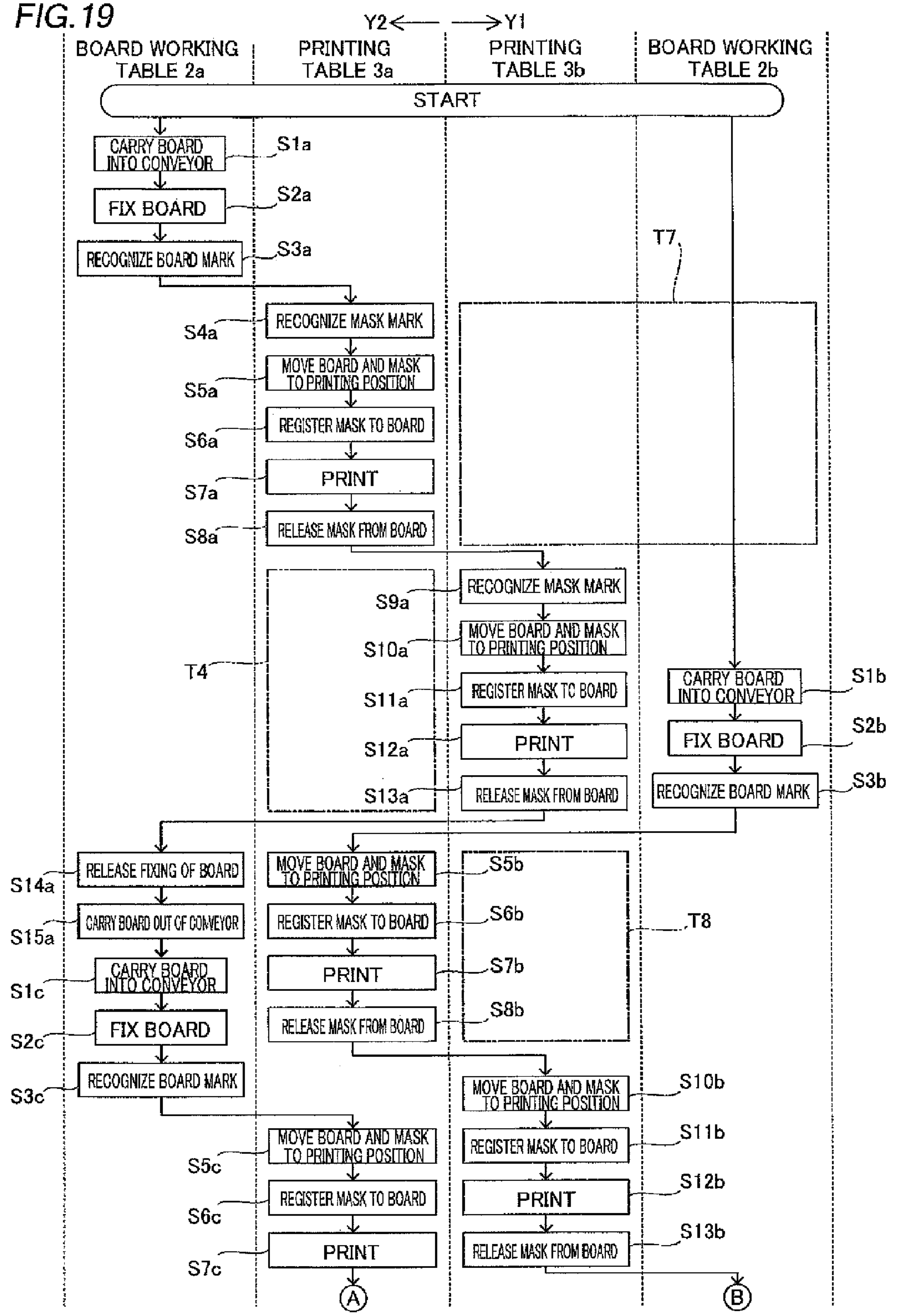

FIG. 19
Y2 Y1
BOARD WORKING TABLE 2a
PRINTING TABLE 3a
PRINTING TABLE 3b
BOARD WORKING TABLE 2b
START
CARRY BOARD INTO CONVEYOR
S1a
FIX BOARD
S2a
RECOGNIZE BOARD MARK
S3a
T7
RECOGNIZE MASK MARK
S4a
MOVE BOARD AND MASK TO PRINTING POSITION
S5a
REGISTER MASK TO BOARD
S6a
PRINT
S7a
RELEASE MASK FROM BOARD
S8a
RECOGNIZE MASK MARK
S9a
MOVE BOARD AND MASK TO PRINTING POSITION
S10a
T4
REGISTER MASK TO BOARD
S11a
CARRY BOARD INTO CONVEYOR
S1b
PRINT
S12a
FIX BOARD
S2b
RELEASE MASK FROM BOARD
S13a
RECOGNIZE BOARD MARK
S3b
RELEASE FIXING OF BOARD
S14a
MOVE BOARD AND MASK TO PRINTING POSITION
S5b
CARRY BOARD OUT OF CONVEYOR
S15a
REGISTER MASK TO BOARD
S6b
T8
CARRY BOARD INTO CONVEYOR
S1c
PRINT
S7b
FIX BOARD
S2c
RELEASE MASK FROM BOARD
S8b
RECOGNIZE BOARD MARK
S3c
MOVE BOARD AND MASK TO PRINTING POSITION
S10b
REGISTER MASK TO BOARD
S11b
MOVE BOARD AND MASK TO PRINTING POSITION
S5c
PRINT
S12b
REGISTER MASK TO BOARD
S6c
RELEASE MASK FROM BOARD
S13b
PRINT
S7c
A
B

BOARD PRINTING APPARATUS AND BOARD PRINTING METHOD

CROSS-REFERENCE TO RELATED APPLICATION

This application is a divisional application of U.S. patent application Ser. No. 14/109,679 filed Dec. 17, 2013, which claims benefit of priority to Japanese Patent Application No. 2012-277468 filed on Dec. 19, 2012, the entire content of which is incorporated herein by reference.

TECHNICAL FIELD

The technical field relates to a board printing apparatus and a board printing method, and more particularly, it relates to a board printing apparatus performing mask-printing on a board and a board printing method.

BACKGROUND

A board printing apparatus performing mask-printing on a board is known in general. Such a board printing apparatus is disclosed in Japanese Patent Laying-Open No. 2006-066811, for example.

Due to miniaturization of electronic components mounted on a printed board, 0603 size (0.6 mm×0.3 mm) or 0402 size (0.4 mm×0.2 mm) small components (very small components) and large components such as a shield component are mixed and mounted on the board. When a viscous material such as solder is printed on the board to mount these components, an appropriate amount of transfer of the viscous material to be printed is generally determined according to the size of a component according to the size of the component.

Japanese Patent Laying-Open No. 2006-066811 discloses a technology to print solder using a single mask (so-called half etching mask) having a large thickness in a printing area corresponding to a large component and a small thickness in a printing area corresponding to a small component (very small component). The amount of transfer of a viscous material on a board corresponds to the thickness of the mask, so that the viscous material can be printed with the amount of material according to the size of a component by using the half etching mask. When the mask disclosed in Japanese Patent Laying-Open No. 2006-066811 is used, however, a step (a boundary between the thickness for the large component and the thickness for the small component) is formed in the printing area, and stable printing pressure for filling an opening with the viscous material cannot be ensured in the vicinity of this step. Thus, a circuit pattern (an opening pattern of the mask) must be formed to avoid the vicinity of the step. Therefore, according to the printing technology disclosed in Japanese Patent Laying-Open No. 2006-066811, the integration degree of a circuit cannot be improved.

Two types of masks, a first mask for the small component having the small thickness and a second mask for the large component having the large thickness, are conceivably prepared to sequentially perform printing. A relief portion is provided on the board contact surface of the second mask to relieve a pattern of a transfer material formed by the first mask, whereby a printing pattern for the large component can be formed by the second mask after a printing pattern for the small component (very small component) is formed by the first mask.

When the two types of masks are used, however, two board printing apparatuses must be provided to create a production line for sequentially performing printing, and hence the structure of the production line is disadvantageously complicated.

SUMMARY

The present disclosure has been proposed in order to solve the aforementioned problem, and an object of the present disclosure is to provide a board printing apparatus and a board printing method each capable of producing a board without complicating the structure of a production line even when two types of masks, a small component mask and a large component mask, are used to perform printing.

In order to attain the aforementioned object, a board printing apparatus according to a first aspect of the present disclosure includes a board working table holding a board to be printed on. A first printing table and a second printing table are aligned in a prescribed direction in a horizontal direction above the board working table, and a control portion controls the printing operations of the first printing table and the second printing table, and while the first printing table holds a small component mask having a first thickness configured to perform a first printing to print a viscous material on the board, the second printing table holds a large component mask having a second thickness thicker than the first thickness, formed with a relief portion having a depth larger than the first thickness on a board contact surface to relieve the viscous material printed by the small component mask, configured to perform a second printing to print the viscous material on the board after the first printing by the first printing table. The board working table and at least one of the first printing table and the second printing table are configured to be movable in the prescribed direction in the horizontal direction. The board working table and at least one of the first printing table and the second printing table are configured to be movable in a vertical direction. The control portion is configured to perform the second printing on the board held by the board working table by the large component mask of the second printing table after the first printing performed on the board held by the board working table by the small component mask of the first printing table.

In the board printing apparatus according to the first aspect of the present disclosure, as hereinabove described, the first printing table holds the small component mask configured to perform the first printing to print the viscous material on the board. The second printing table holds the large component mask formed with the relief portion having the depth larger than the first thickness on the board contact surface to relieve the viscous material printed by the small component mask, configured to perform the second printing to print the viscous material on the board after the first printing performed by the first printing table. The control portion is configured to perform the second printing on the board held by the board working table by the large component mask of the second printing table after the first printing performed on the board held by the board working table by the small component mask of the first printing table. Thus, the first printing using the small component mask (very small component mask) and the second printing using the large component mask can be performed by the single board printing apparatus. Thus, it is not necessary to provide two board printing apparatuses in a production line, and hence the board can be produced without complicating the structure of the production line even in the case where printing is performed using two types of masks, the small component mask and the large component mask.

In the aforementioned board printing apparatus according to the first aspect, the control portion is preferably configured to perform the printing preparation operation of one of the first printing table and the second printing table during the board printing operation of the other of the first printing table and the second printing table. According to this structure, the preparation operation for subsequent printing can be performed in advance in one of the first printing table and the second printing table, utilizing a standby period during the board printing operation of the other of the first printing table and the second printing table. Consequently, the time required for board printing (the time required for the board printing operation and the printing preparation operation) can be reduced even in the case where the first printing and the second printing are performed by the single board printing apparatus.

In this case, the first printing table and the second printing table are preferably configured to be movable in the prescribed direction in the horizontal direction, and the control portion is preferably configured to move the second printing table closer to a printing position by moving the second printing table in the prescribed direction in the horizontal direction such that a distance between the first printing table and the second printing table is reduced in the prescribed direction in the horizontal direction during the board printing operation of the first printing table. According to this structure, part of the operation of the movement of the second printing table to the printing position can be performed during the board printing operation of the first printing table, and hence the time required for board printing can be reduced when the second printing is performed by the second printing table.

In the aforementioned structure in which the second printing table is moved closer to the printing position during the board printing operation of the first printing table, the control portion is preferably configured to move the second printing table closer to the printing position until an interval between the second printing table and the first printing table becomes an accessible minimum interval without interference during the board printing operation. According to this structure, the second printing table can be moved as close as possible to the printing position during the board printing operation of the first printing table, and hence the time required for board printing can be effectively reduced when the second printing is performed by the second printing table.

In this case, the control portion is preferably configured to locate the second printing table at the printing position by moving the first printing table and the second printing table while keeping a distance equal to or more than the minimum interval when the second printing is performed by the second printing table after the second printing table is moved closer to the printing position. According to this structure, when it is necessary to evacuate the first printing table in order to locate the second printing table at the printing position, for example, the time required for the movement of the second printing table to the printing position can be reduced, as compared with the case where the first printing table and the second printing table are moved in order (individually).

In the aforementioned structure in which the printing preparation operation of one of the first printing table and the second printing table is performed during the board printing operation of the other of the first printing table and the second printing table, the first printing table and the second printing table are preferably configured to be movable in the vertical direction, and the control portion is preferably configured to lower the second printing table from the large component mask plate releasing height position of the large component mask separated from the board after the second printing of the viscous material to a standby height position lower than the large component mask plate releasing height position, where the viscous material on the board is in non-contact with the large component mask during a board printing operation using the small component mask of the first printing table. According to this structure, during the board printing operation (first printing) of the first printing table, part of the lowering operation for registering the large component mask to the board can be performed in the second printing table. Consequently, the time required for board printing can be reduced when the second printing is performed by the second printing table.

In this case, the standby height position preferably includes a height position determined on the basis of at least the first thickness of the small component mask and the amount of deflection of the large component mask. According to this structure, the viscous material having a height corresponding to the first thickness is formed on the board after the first printing when the second printing is performed, and hence the large component mask can be arranged at the standby height position where the large component mask is moved as close as possible to the board after the first printing in consideration of the first thickness and the amount of deflection of the large component mask. Thus, the time required for board printing can be effectively reduced when the second printing is performed by the second printing table.

In the aforementioned structure in which the printing preparation operation of one of the first printing table and the second printing table is performed during the board printing operation of the other of the first printing table and the second printing table, the board working table preferably includes a first board working table and a second board working table each configured to be movable in the prescribed direction in the horizontal direction. Each of the first board working table and the second board working table preferably has a mask recognition camera capable of recognizing the small component mask and the large component mask. The control portion is preferably configured to perform mask recognition of the large component mask of the second printing table using the second board working table during a board printing operation performed by the first board working table and the first printing table using the small component mask. According to this structure, the mask recognition for aligning the large component mask with the board can be performed in advance in the second printing table during the board printing operation (first printing) of the first printing table using the small component mask. Consequently, the second printing can be immediately performed by the large component mask that has been already recognized after the first printing, and hence the time required for board printing can be reduced when the second printing is performed.

In this case, the control portion is preferably configured to perform the mask recognition of the large component mask using the second board working table at least when a board printing operation is first performed by the first board working table and the first printing table. According to this structure, it is necessary to align the mask with the board by the mask recognition operation when the board printing operation is first performed, and hence at least the first mask recognition operation is performed in advance, whereby the second printing can be immediately started. If mask recognition is performed at least when the printing is first performed, the mask recognition can be skipped by utilizing the prior mask recognition result.

In the aforementioned structure in which the printing preparation operation of one of the first printing table and the second printing table is performed during the board printing operation of the other of the first printing table and the second printing table, the board working table preferably includes a first board working table and a second board working table each configured to be movable in the prescribed direction in the horizontal direction. Each of the first board working table and the second board working table preferably has a cleaning unit configured to clean the small component mask and the large component mask. The control portion is preferably configured to perform a mask cleaning operation for the small component mask of the first printing table using the first board working table while the second board working table and the second printing table perform a board printing operation on the board after the first printing using the large component mask. According to this structure, the mask cleaning operation for the small component mask can be performed in the first printing table during the board printing operation (second printing) of the second printing table after the board printing (first printing) of the first printing table. Consequently, the time required for the printing preparation operation can be reduced when the first printing is performed on a subsequent board by the first printing table.

In this case, the first printing table and the second printing table are preferably configured to be movable in the prescribed direction in the horizontal direction. The control portion is preferably configured to move the first printing table in a direction away from the second printing table and perform the mask cleaning operation for the small component mask at a position separated from the second printing table while the second board working table and the second printing table perform the board printing operation. According to this structure, the first printing table can be separated from the second printing table during the mask cleaning operation, and hence a work space for the mask cleaning operation can be ensured during the second printing performed by the second printing table.

In the aforementioned structure in which the printing preparation operation of one of the first printing table and the second printing table is performed during the board printing operation of the other of the first printing table and the second printing table, the board working table preferably includes a first board working table and a second board working table each configured to be movable in the prescribed direction. The control portion is preferably configured to perform at least one of the operations of carrying the board into one of the first board working table and the second board working table and carrying the board out of the other of the first board working table and the second board working table during a board printing operation performed by one of the first printing table and the second printing table and the other of the first board working table and the second board working table. According to this structure, at least one of the operations of carrying the board into one of the first board working table and the second board working table and carrying the board out of the other of the first board working table and the second board working table can be performed during the board printing operation performed by the other of the first board working table and the second board working table, and hence the time required for the printing preparation operation (the operation of carrying the board into one of the first board working table and the second board working table and the operation of carrying the board out of the other of the first board working table and the second board working table) can be reduced when printing is performed on the subsequent board even in the case where the first printing and the second printing are performed by the single board printing apparatus.

In the aforementioned board printing apparatus according to the first aspect, the board working table preferably includes a first board working table and a second board working table each configured to be movable in the prescribed direction. The control portion is preferably configured to perform a board printing operation of the first printing on a second board before the first printing by the first printing table and one of the first board working table and the second board working table during a board printing operation of the second printing performed on a first board after the first printing by the second printing table and the other of the first board working table and the second board working table. According to this structure, during the second printing performed on the first board, the first printing can be performed in advance on a board (second board) to be printed on next. Consequently, the time required for the board printing operation can be reduced when printing is performed on the subsequent board even in the case where the first printing and the second printing are performed by the single board printing apparatus.

A board printing method according to a second aspect of the present disclosure is a board printing method of a board printing apparatus including a first printing table and a second printing table each configured to print a viscous material on a board and includes the steps of performing first printing on the board held by a board working table by a small component mask of the first printing table and performing second printing on the board held by the board working table after the first printing by a large component mask of the second printing table.

As hereinabove described, this board printing method according to the second aspect of the present disclosure includes the steps of performing the first printing on the board held by the board working table by the small component mask of the first printing table and performing the second printing on the board held by the board working table after the first printing by the large component mask of the second printing table, whereby the first printing using the small component mask (very small component mask) and the second printing using the large component mask can be performed by the single board printing apparatus. Thus, it is not necessary to provide two board printing apparatuses in a production line, and hence the board can be produced without complicating the structure of the production line even in the case where printing is performed using two types of masks, the small component mask and the large component mask.

The aforementioned board printing method according to the second aspect preferably further includes a step of performing a printing preparation operation performed for one of the step of performing the first printing by the first printing table and the step of performing the second printing by the second printing table during a board printing operation of the other of the step of performing the first printing by the first printing table and the step of performing the second printing by the second printing table. According to this structure, the preparation operation for subsequent printing can be performed in advance in one of the first printing table and the second printing table, utilizing a standby period during the board printing operation of the other of the first printing table and the second printing table. Consequently, the time required for board printing (the time required for the board printing operation and the printing preparation operation) can be reduced even in the case where the first printing and the second printing are performed by the single board printing apparatus.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 19 is a control flowchart (first half) showing the operational outline of the printing apparatus according to the sixth embodiment of the present disclosure during a board printing operation.

DETAILED DESCRIPTION

Embodiments of the present disclosure are hereinafter described with reference to the drawings.

(First Embodiment)

The structure of a printing apparatus 100 according to a first embodiment of the present disclosure is now described with reference to FIGS. 1 to 6. In the first embodiment, the "board printing apparatus" according to the present disclosure is applied to the printing apparatus 100.

Figure 1:
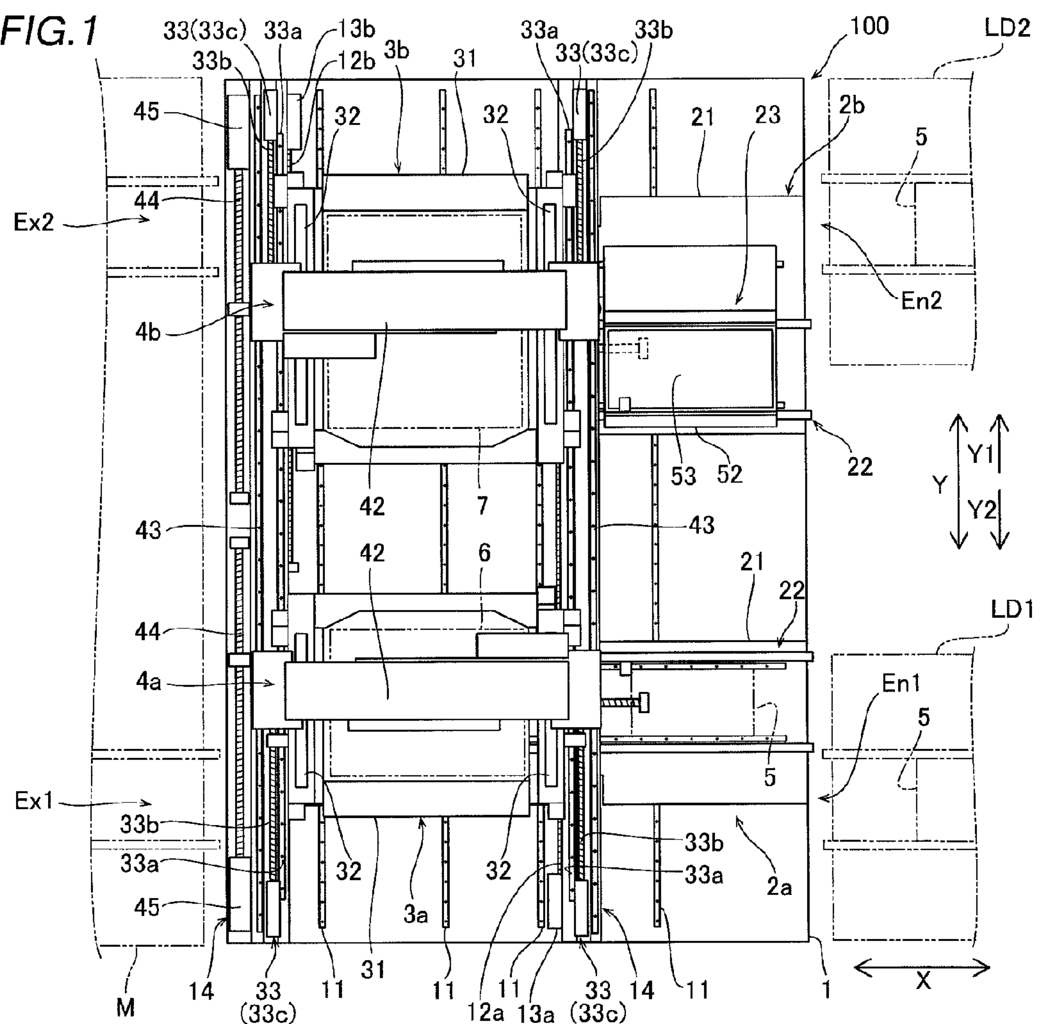
FIG. 1 is a plan view schematically showing a printing apparatus according to a first embodiment of the present disclosure.
Figure 2:
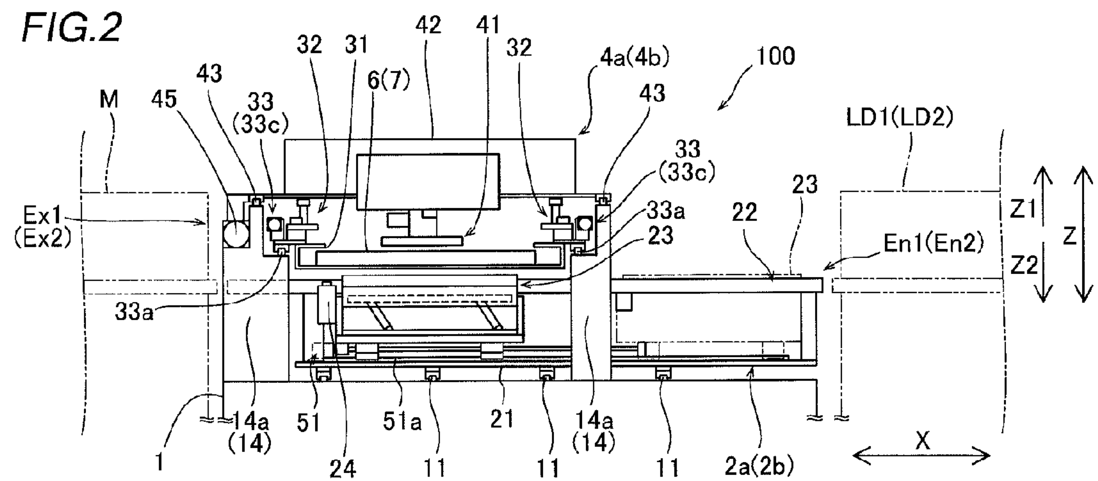
FIG. 2 is a side elevational view schematically showing the printing apparatus according to the first embodiment of the present disclosure as viewed in a direction Y.
Figure 3:
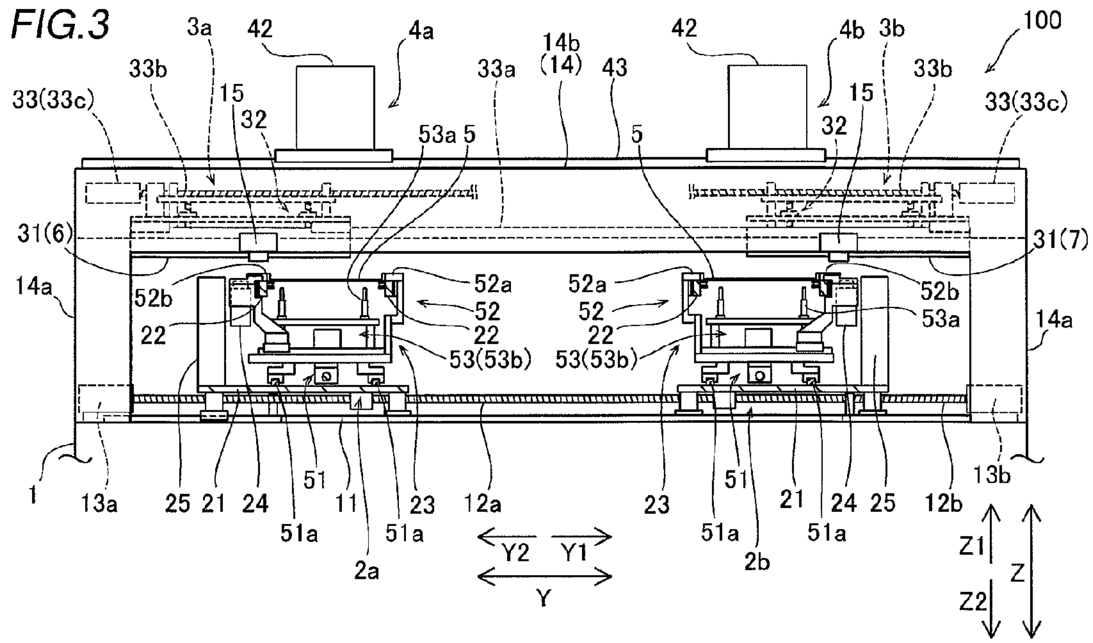
FIG. 3 is a sectional view schematically showing a board working table constituting the printing apparatus according to the first embodiment of the present disclosure as viewed in a direction X.

The printing apparatus 100 according to the first embodiment of the present disclosure is a board printing apparatus mask-printing solder paste on the upper surface of a printed board (hereinafter referred to as the "board") 5 conveyed into an apparatus body, as shown in FIGS. 1 to 3.

As shown in FIG. 1, the printing apparatus 100 is configured to be capable of carrying the board 5 thereinto from a loader DL1 at a carry-in position Ent and from a loader LD2 at a carry-in position En2 on the upstream side in a conveyance direction (the right side in a direction X) and to carry the board 5 on which printing has been performed thereout to an apparatus M on the downstream side in the conveyance direction (the left side in the direction X) through a carry-out position Ex1 or Ex2 on the downstream side. The carry-out positions Ex1 and Ex2 are aligned with the carry-in positions En1 and En2 in the direction X, respectively. The conveyance direction of the board 5 is the direction X, and a direction orthogonal to the direction X in a horizontal plane is a direction Y. A vertical direction orthogonal to the directions X and Y is a direction Z. The direction Y is an example of the "prescribed direction in a horizontal direction" in the present disclosure. Due to this structure, the printing apparatus 100 partially constitutes a board production line of a printed circuit board having two conveyance lines.

The printing apparatus 100 includes a base 1, two board working tables 2*a* and 2*b* holding and conveying the board 5, two printing tables 3*a* and 3*b*, and two squeegee units 4*a* and 4*b*. The board working table 2*a*, the printing table 3*a*, and the squeegee unit 4*a* are arranged on the Y2 side of the printing apparatus 100, and the board working table 2*b*, the printing table 3*b*, and the squeegee unit 4*b* are arranged on the Y1 side of the printing apparatus 100. A controller 80 (see FIG. 6) described later configured to control the operation of each part described below is incorporated in the printing apparatus 100. The board working tables 2*a* and 2*b*are examples of the "first board working table" and the "second board working table" in the present disclosure, respectively. The printing tables 3*a* and 3*b* are examples of the "first printing table" and the "second printing table" in the present disclosure, respectively.

The two board working tables 2*a* and 2*b* are aligned in the direction Y and have functions of receiving the board 5 at the corresponding carry-in positions En1 and En2, supporting and fixing the board 5 while being opposed to the printing tables 3*a* and 3*b* during a printing operation, and carrying the board 5 on which printing has been performed thereout through the corresponding carry-out positions Ex1 and Ex2. The carry-in position Enl and the carry-out position Ex1 on the Y2 side correspond to the board working table 2*a*, and the carry-in position En2 and the carry-out position Ex2 on the Y1 side correspond to the board working table 2*b*.

As shown in FIGS. 1 to 3, the board working tables 2*a* and 2*b* each include a movable stand 21 configured to be movable in the direction Y, a conveying conveyor 22 including a pair of conveyor rails extending in the conveyance direction (direction X) arranged on the movable stand 21, a clamp unit 23 configured to be movable in the direction X while holding (fixing) the board 5 to allow a printing operation in a state where the board 5 on the conveying conveyor 22 is separated upward from the conveying conveyor 22, a mask recognition camera 24 provided on the clamp unit 23, and a cleaning unit (see FIG. 3) arranged on the movable stand 21. The board working table 2*a* is substantially similar in structure to the board working table 2*b*, and hence the individual description is omitted.

As shown in FIG. 1, the movable stand 21 is supported to be movable in the direction Y on a guide rails 11 extending in the direction Y on the base 1. The movable stands 21 of the board working tables 2*a* and 2*b* are configured to be moved individually in the direction Y on the guide rail 11 by two table drive mechanisms. Specifically, the movable stands 21 of the board working tables 2*a* and 2*b* are driven in the direction Y by screw shafts 12*a* and 12*b* extending in the direction Y and servomotors 13*a* and 13*b* drivingly rotating the screw shafts 12*a* and 12*b*, respectively, as shown in FIG. 3. Thus, the board working tables 2*a* and 2*b* are configured to be individually movable along a Y-axis (in the direction Y) to at least the positions of the printing tables 3*a* and 3*b* on an opposite side in the direction Y and have common movement regions (the movement ranges overlap with each other).

As shown in FIGS. 1 and 2, the conveying conveyor 22 is provided to extend over the substantially entire length of the printing apparatus 100 in the direction X and can carry the board thereinto and thereout by aligning the position of the conveying conveyor 22 with the Y-axis coordinates of the carry-in position En1 (En2) and the carry-out position Ex1 (Ex2). Each conveying conveyor 22 can move one of the pair of conveyor rails in the direction Y on the movable stand 21 and change the conveyor width (an interval between the conveyor rails) according to the size of the conveyed board 5.

As shown in FIG. 3, the clamp unit 23 is a movable unit provided to hold the conveying conveyor 22 including the pair of conveyor rails from both outer sides in the direction Y. The clamp unit 23 is configured to be movable in the direction X on guide rails 51*a* by an X-axis movement mechanism (see FIG. 2) extending in the direction X provided on the movable stand 21. Thus, the clamp unit 23 is movable in the direction X along the conveying conveyor 22. The width of the clamp unit 23 in the direction Y can be changed according to the conveyor width of the conveying conveyor 22.

The clamp unit 23 includes a clamp mechanism 52 configured to grasp and fix the board 5 and a support mechanism 53 configured to lift and support the board 5 on the conveying conveyor 22. The clamp mechanism 52 is configured to be capable of holding the board 5 on the conveying conveyor 22 from both sides in the direction Y and grasping the board 5 by driving an unshown air cylinder and displacing a clamp portion 52*b* in a direction approaching a clamp portion 52*a*. If the air cylinder is activated in an opposite direction, the clamp is released.

The support mechanism 53 includes a backup pin 53*a* and a lift mechanism 53*b* vertically moving the backup pin 53*a* and is configured to lift and support the board 5 on the conveying conveyor 22 by the lift mechanism 53*b* and the backup pin 53*a* by bringing the backup pin 53*a* into contact with the lower surface of the board 5 from below. The board 5 lifted by the support mechanism 53 is grasped by the clamp mechanism 52, whereby the board 5 is fixedly held in a state separated above from the conveying conveyor 22, and a printing operation can be performed on the board 5 on the board working table 2*a* (2*b*).

The mask recognition camera 24 includes a CCD area sensor etc. and is mounted on the outside of the clamp unit 23 in the direction Y such that the imaging direction faces upward. Therefore, the mask recognition camera 24 is movable in the direction Y due to the movement of the board working table 2*a* (2*b*) and is movable in the direction X due to the movement of the clamp unit 23. The mask recognition camera 24 is provided to image mask recognition marks Q (see FIG. 8) attached to the lower sides of screen masks (a small component mask 6 and a large component mask 7 described later) held by the printing tables 3*a* and 3*b* from below and recognize the positions and postures of the masks (the small component mask 6 and the large component mask 7).

The detailed illustration of the cleaning unit 25 is omitted, but the cleaning unit 25 includes a cleaning head having a pad brought into contact with the board contact surfaces (lower surfaces) of the screen masks (the small component mask 6 and the large component mask 7) and a suction nozzle performing negative-pressure suction through the pad. The board working table 2*a* (2*b*) and the masks are relatively moved (slid) in the direction Y in a state where the cleaning head is brought into contact with the board contact surfaces of the masks, whereby solder paste attached to the board contact surfaces or openings of the masks can be removed. The cleaning head can move up and down vertically with respect to the board working table 2*a* (2*b*), and is configured to evacuate to a lower position where the cleaning head is not in contact with the masks except for during mask cleaning.

As shown in FIGS. 2 and 3, a pair of frame structures 14 provided to extend in the direction Y over the two board working tables 2*a* and 2*b* are arranged on the base 1 at a prescribed interval in the direction X (in the board conveyance direction). Each of the frame structures 14 has a portal structure and includes a pair of legs 14*a* extending upward from the vicinities of both ends of the base 1 in the direction Y and a beam 14*b* connecting the upper ends of the legs 14*a* to each other in the horizontal direction.

Two board recognition cameras 15 (see FIG. 3) are fixedly set on the lower side of a frame structure 14 (beam 14*b*) on the upstream side in the conveyance direction (the right side in FIG. 1) straddling over the board working tables 2*a* and 2*b*. The two board recognition cameras 15 are provided corresponding to the board working tables 2*a* and 2*b* and are arranged at a prescribed interval in the direction Y. These board recognition cameras 15 each include a CCD area sensor etc. and are set such that the imaging direction faces downward. The board recognition cameras 15 each are configured to image unshown board recognition marks attached to the upper surface of the board 5 and recognize the position and posture of the board 5 grasped by the clamp unit 23.

As shown in FIGS. 1 and 2, both sides of each of the printing tables 3*a* and 3*b* in the direction X are supported by a pair of guide rails 33*a* provided on the pair of frame structures 14, and the printing tables 3*a* and 3*b* are arranged above the board working tables 2*a* and 2*b*. The printing tables 3*a* and 3*b* each are configured to be movable in the direction Y along the guide rails 33*a* extending in the direction Y and be movable vertically (in the direction Z). Specifically, the printing tables 3*a* and 3*b* each have a substantially rectangular mask fixing member 31 detachably mounted with a screen mask, a mask lift mechanism 32 moving (moving along a Z-axis) the mask fixing member 31 up and down, and a pair of mask drive mechanisms 33 configured to rotate the mask fixing member 31 about the Z-axis and move the mask fixing member 31 in the direction Y.

Figure 4:
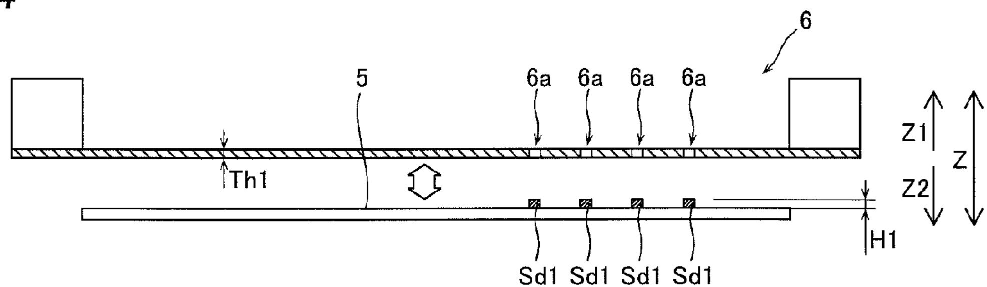
FIG. 4 is a schematic view showing a small component mask of the printing apparatus according to the first embodiment of the present disclosure.

According to the first embodiment, the mask fixing member 31 of the printing table 3*a* is mounted with the small component mask (very small component mask) 6. The small component mask 6 is formed with minute openings 6*a* in a pattern corresponding to lands of a 0603 size or 0402 size small component, for example, as shown in FIG. 4. The thickness of the small component mask 6 is a first thickness Th1 (about 50 μm to about 75 μm, for example) appropriate for a small component. Solder printing is performed with the small component mask 6, whereby solder Sd1 having a solder height H1 appropriate for a small component is formed on a surface (printing surface) of the board 5. The solder height H1 is equal to the first thickness Th1 or slightly smaller than the first thickness Th1 due to gravity acting on the solder Sd1. The solder Sd1 is an example of the "viscous material" in the present disclosure.

Figure 5:
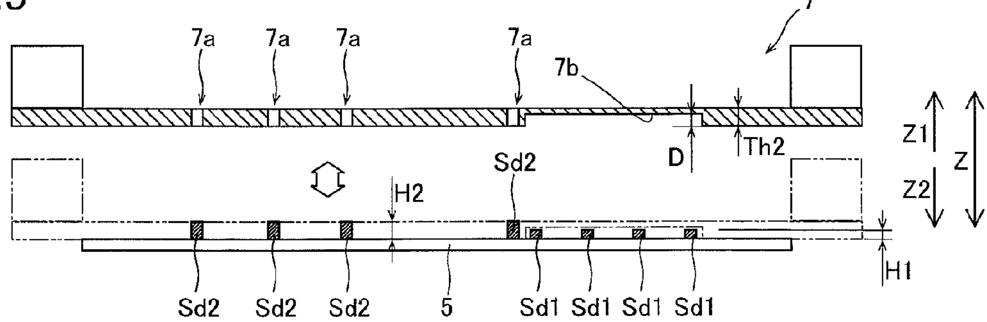
FIG. 5 is a schematic view showing a large component mask of the printing apparatus according to the first embodiment of the present disclosure.

On the other hand, the mask fixing member 31 of the printing table 3*b* is mounted with the large component mask 7, as shown in FIG. 1. The large component mask 7 is formed with openings 7*a* in a pattern corresponding to lands of a large component such as a shield component, as shown in FIG. 5. The thickness of the large component mask 7 is a second thickness Th2 (about 150 μm, for example) appropriate for a large component, larger than the thickness of the small component mask 6. A recessed relief portion 7*b* is formed on the board contact surface (lower surface) of the large component mask 7 to cover a prescribed region corresponding to the opening pattern of the small component mask 6. The depth D of the recessed relief portion 7*b* is larger than the thickness (first thickness) Th1 of the small component mask 6 (i.e. Th2>Th1). Thus, the depth D is larger than the solder height H1 of the solder Sd1 formed by the small component mask 6. Therefore, when the large component mask 7 is registered to the board 5 after first printing using the small component mask 6, the solder Sd1 formed by the small component mask 6 fits into the recessed relief portion 7*b*, and the large component mask 7 and the solder Sd1 are kept out of contact. In this state, solder printing is performed with the large component mask 7, whereby in addition to the solder Sd1, solder Sd2 having a solder height H2 (the solder height H2 is equal to the second thickness Th2 or slightly smaller than the second thickness Th2 due to gravity acting on the solder Sd2, and H2>H1) appropriate for a large component is formed on the board 5. The solder Sd2 is an example of the "viscous material" in the present disclosure.

As shown in FIG. 2, the mask lift mechanism 32 is configured to support the mask fixing member 31 and move the mask fixing member 31 up and down by an unshown guide, an unshown screw shaft, and an unshown Z-axis motor driving the screw shaft. Both ends of the mask lift mechanism 32 in the direction X are supported on the pair of guide rails 33*a*.

The pair of mask drive mechanisms 33 include the pair of guide rails 33*a*, screw shafts 33*b* (see FIG. 1), and Y-axis motors 33*c* driving the screw shafts 33*b* and are set on the pair of frame structures 14. The pair of mask drive mechanisms 33 are configured to be capable of driving the mask lift mechanism 32 in the direction Y from both sides in the direction X. If the pair of mask drive mechanisms 33 are driven at the same speed, the mask lift mechanism 32 as well as the mask fixing member 31 can be moved in the direction Y in a parallel fashion, and if the pair of mask drive mechanisms 33 are driven at different speeds, the mask lift mechanism 32 as well as the mask fixing member 31 can be rotated in the horizontal plane (X-Y plane).

Thus, the printing table 3*a* (3*b*) can perform printing on the board 5 at an arbitrary position in the direction Y within a movement range and can minutely align the held small component mask 6 (large component mask 7) (the position in the direction Y and the inclination in the horizontal plane) in the X-Y plane. The position in the direction X is aligned by movement adjustment of the clamp unit 23. The printing table 3*a* (3*b*) is configured to move down along arrow Z2 by the mask lift mechanism 32 and perform a plate registering operation of bringing the small component mask 6 (large component mask 7) into contact with the upper surface of the board 5 during printing and to move up along arrow Z1 and perform a plate releasing operation of releasing the small component mask 6 (large component mask 7) from the upper surface of the board 5 after printing.

In this manner, according to the first embodiment, the printing apparatus 100 divides opening patterns of the single board 5 for solder printing into the small component mask 6 (the pattern of the openings 6*a* for a small component) and the large component mask 7 (the pattern of the openings 7*a* for a large component) having the different thicknesses and prints solder individually. Thus, the solder Sd1 and solder Sd2 each having an aspect ratio (the solder height/the base area of the solder, i.e. the mask thickness/the opening area) according to the component size can be formed on the surface (printing surface) of the board 5.

As shown in FIGS. 1 and 2, the squeegee units 4*a* and 4*b* each are supported at a central portion of a movable beam 42 extending in the direction X and are arranged above the corresponding printing table 3*a* (3*b*). The squeegee unit 4*a* and 4*b* each include a squeegee 41 (see FIG. 2) sliding back and forth in the direction Y while pressing solder paste against the upper surface (Z1 side) of the small component mask 6 (large component mask 7), an unshown lift mechanism moving the squeegee 41 up and down during printing, and an unshown squeegee angle variable mechanism configured to vary the inclination direction and inclination angle of the squeegee 41 with respect to the small component mask 6 (large component mask 7). The movable beam 42 is movably supported on a pair of guide rails 43 provided to extend in the direction Y on the upper surfaces of the pair of frame structures 14. The movable beam 42 is configured to be movable in the direction Y by a screw shaft 44 extending in the direction Y, provided in the frame structures 14 and a squeegee shaft motor 45. The squeegee unit 4*a* (4*b*) as well as the squeegee 41 is moved in the direction Y following the movement of the movable beam 42 to perform a printing operation. The squeegee unit 4*a* performs printing on the board 5 using the corresponding printing table 3*a* (small component mask 6), and the squeegee unit 4*b* performs printing on the board 5 using the corresponding printing table 3*b* (large component mask 7).

Figure 6:
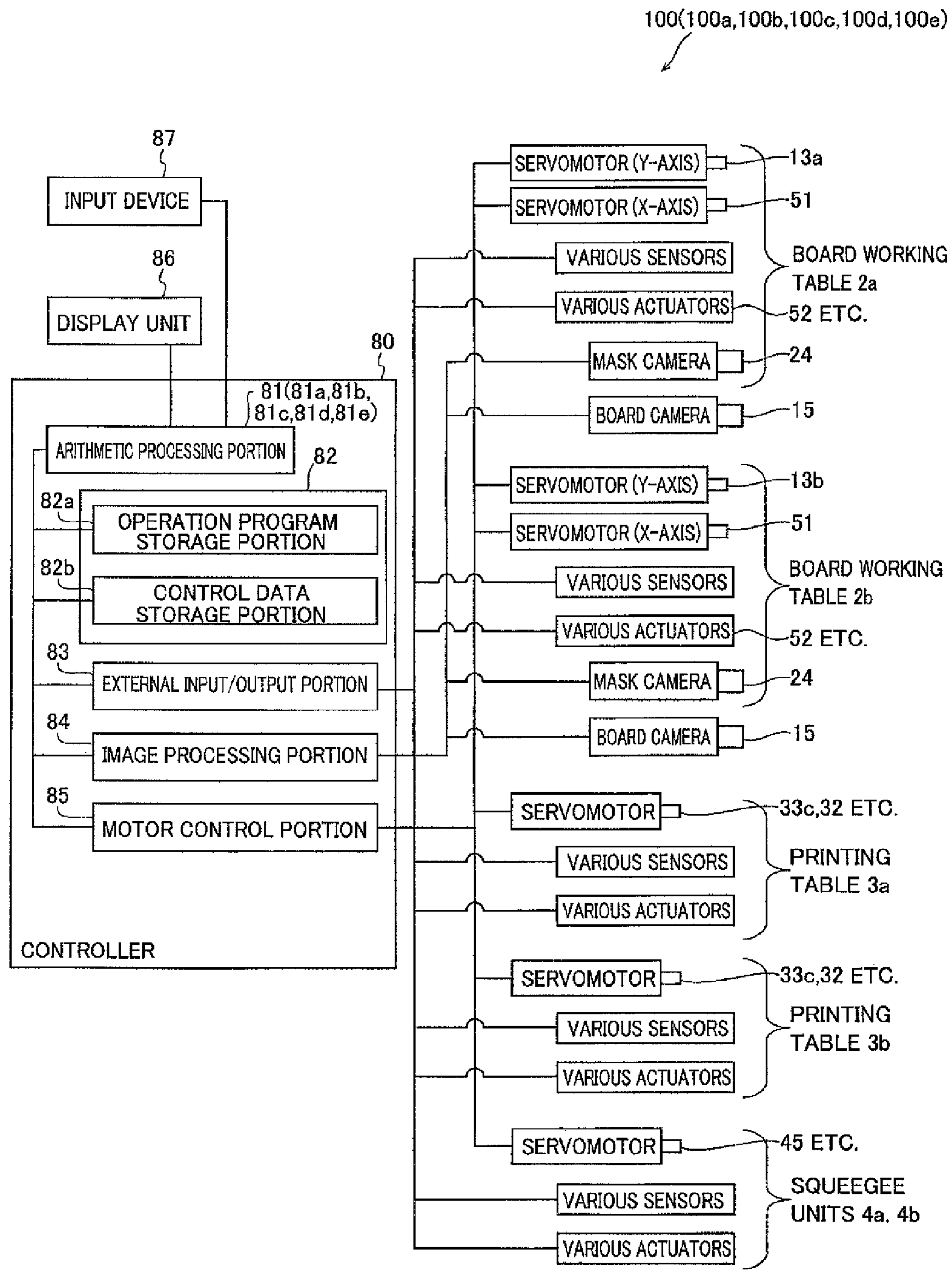
FIG. 6 is a block diagram showing the control structure of a printing apparatus according to first to sixth embodiments of the present disclosure.

As shown in FIG. 6, the controller 80 is mainly constituted by an arithmetic processing portion 81, a storage portion 82, an external input/output portion 83, an image processing portion 84, and a motor control portion 85. The controller 80 is connected to a display unit 86 and an input device 87. The arithmetic processing portion 81 is an example of the "control portion" in the present disclosure.

The arithmetic processing portion 81 includes a CPU and generally controls the operation of the printing apparatus 100. The storage portion 82 includes an operation program storage portion 82*a* storing a control program etc. capable of being executed by the arithmetic processing portion 81 and a control data storage portion 82*b* storing data required when a printing operation is performed.

The external input/output portion 83 has a function of controlling input from/output to various sensors and actuators. The image processing portion 84 performs processing on image data imaged by the board recognition cameras 15 and the mask recognition cameras 24 and internally generates data required for the operation of the printing apparatus 100.

The motor control portion 85 is configured to control various servomotors (a servomotor 13*a* (13*b*) (see FIG. 1) moving the board working table 2*a* (2*b*) in the direction Y, servomotors (not shown) of the X-axis movement mechanisms 51 moving the clamp units 23 in the direction X, the Y-axis motors 33*c* of the printing tables 3*a* and 3*b*, Z-axis motors (not shown) for the mask lift mechanisms 32, etc. of the printing apparatus 100 on the basis of a control signal output from the arithmetic processing portion 81. The motor control portion 85 is configured to be capable of recognizing the position coordinates of the board working tables 2*a* and 2*b* along the Y-axis, the positions of the clamp units 23 in the X-Y plane, the position coordinates along the Y-axis, the height positions (in the direction Z), and the rotation positions (the rotation angles in the X-Y plane) of the printing tables 3*a* and 3*b*, etc. on the basis of signals from encoders (not shown) that the servomotors have.

According to the first embodiment, the controller 80 (arithmetic processing portion 81) is configured to perform control of performing a solder printing operation on the single board 5 by performing second printing by the printing table 3*b* including the large component mask 7 for a large component after performing the first printing by the printing table 3*a* including the small component mask 6 for a small component. In other words, the printing apparatus 100 sequentially performs the first printing by the printing table 3*a* and the second printing by the printing table 3*b* after the first printing on the single board 5.

Operation control in the printing apparatus 100 according to the first embodiment of the present disclosure during a board printing operation is now described with reference to FIGS. 4, 5, and 7 to 10. A printing operation performed on the board 5 carried into the board working table 2*a* is described below as an example of a printing operation. The following control processing is performed by the controller 80 (arithmetic processing portion 81).

Figure 7:
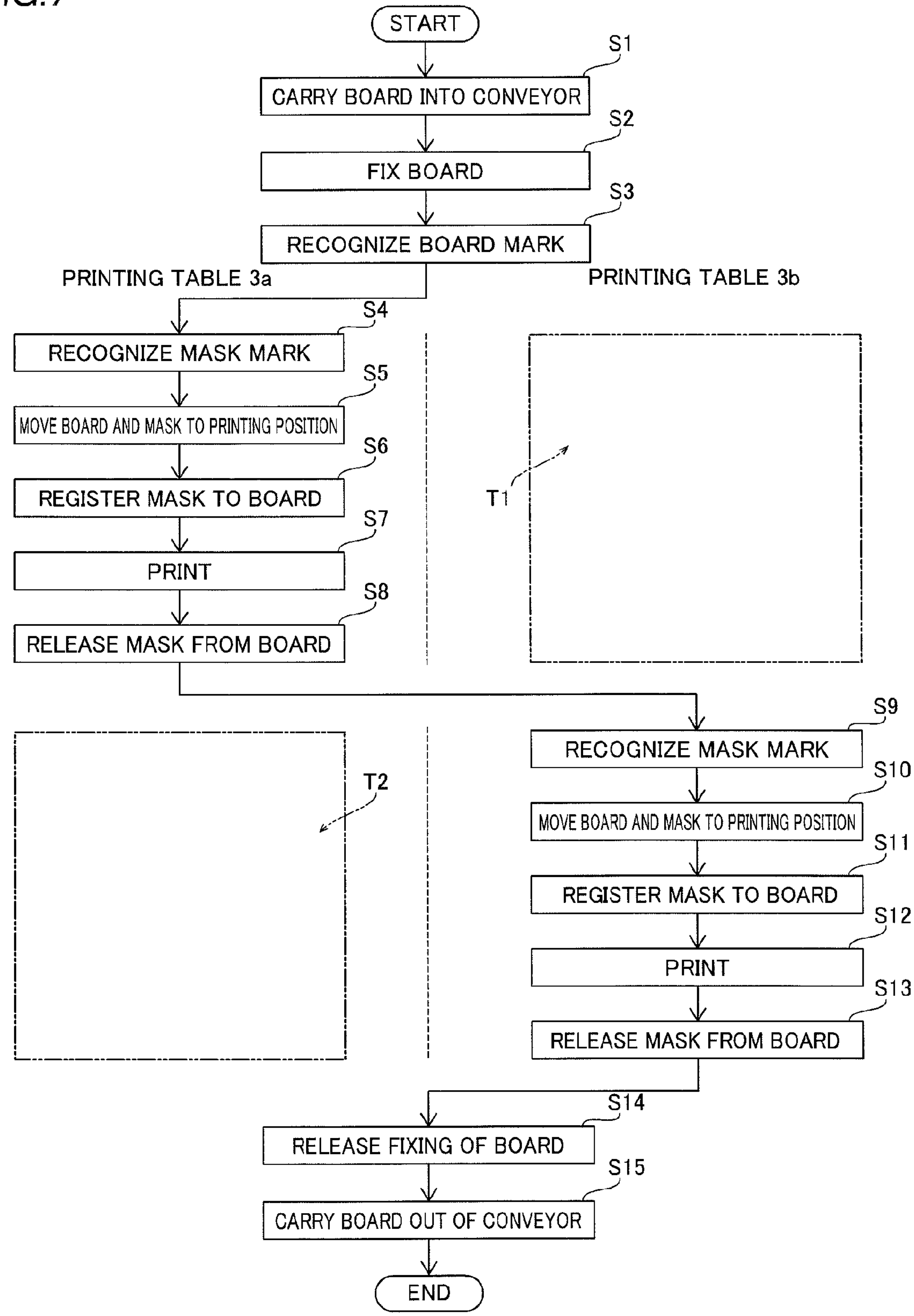
FIG. 7 is a control flowchart showing the operational outline of the printing apparatus according to the first embodiment of the present disclosure during a board printing operation.
Figure 8:
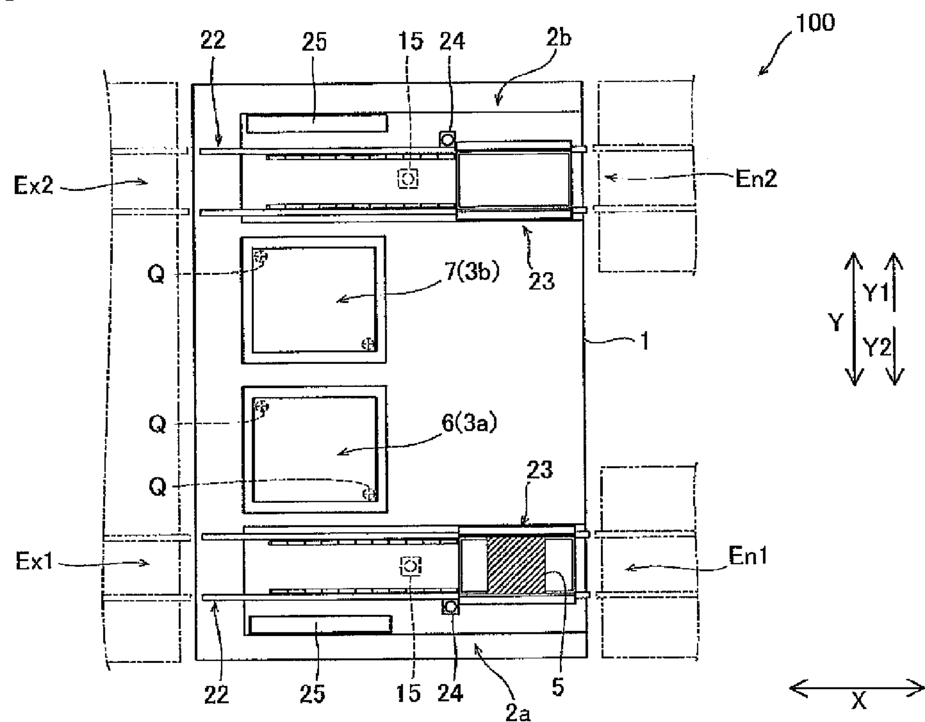
FIG. 8 is a schematic view showing the positional relationship of the printing apparatus according to the first embodiment of the present disclosure during the board printing operation (when a board is carried into the printing apparatus).

As shown in FIGS. 7 and 8, the arithmetic processing portion 81 aligns the Y-coordinate of the board working table 2*a* with the carry-in position En1 and carries the board 5 onto the conveying conveyor 22 at step S1. After the board 5 is carried onto the conveying conveyor 22, the board 5 is clamped (fixed) by the clamp unit 23 at step S2.

At step S3, the clamp unit 23 of the board working table 2*a* starts to move in the direction X to the printing table 3*a* while the board working table 2*a* starts to move in the direction Y, and the movement in the direction X of the clamp unit 23 holding the board 5 and the movement in the direction Y of the board working table 2*a* are synchronously performed. During this movement, the board recognition marks (not shown) of the board 5 are located below the board recognition camera 15, and the board recognition marks of the board 5 are imaged (the image is recognized) by the board recognition camera 15.

At step S4, the mask recognition camera 24 of the clamp unit 23 of the board working table 2*a* is located below the mask recognition marks Q of the small component mask 6 of the printing table 3*a*, and the mask recognition marks Q are imaged (the image is recognized) by the mask recognition camera 24. Due to the image recognition at steps S3 and S4, the relative positional relationship between the position and posture in the horizontal direction of the board 5 held by the clamp unit 23 and the position and posture in the horizontal direction of the small component mask 6 mounted on the printing table 3*a* is acquired.

Figure 9:
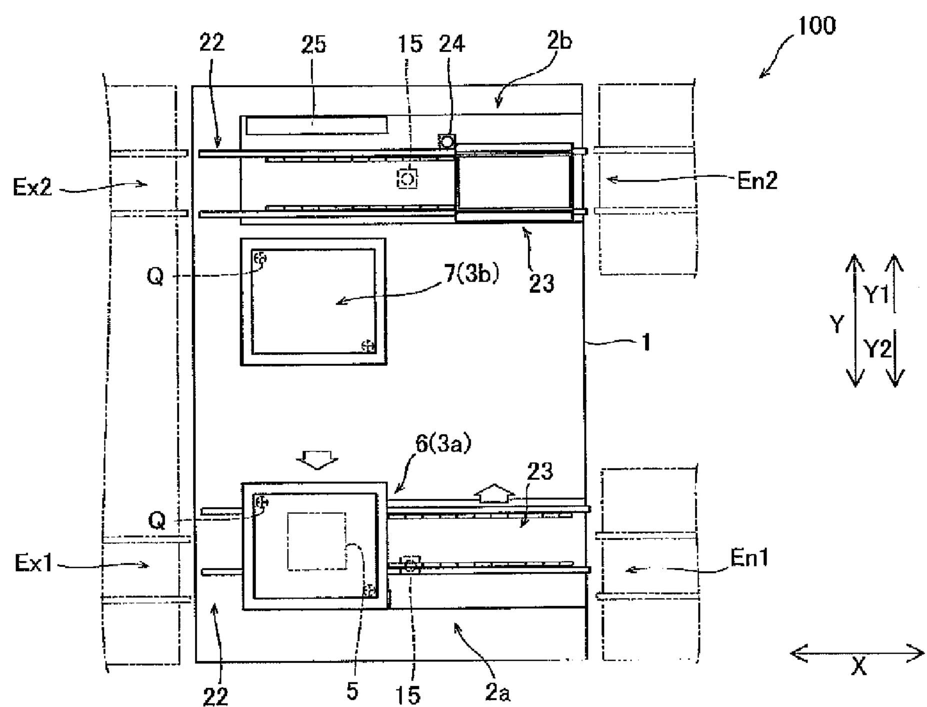
FIG. 9 is a schematic view showing the positional relationship of the printing apparatus according to the first embodiment of the present disclosure during the board printing operation (first printing).

At step S5, the board 5 held by the clamp unit 23 and the small component mask 6 held by the printing table 3*a* are moved to a printing position. In other words, on the basis of the results of the recognition at steps S3 and S4, the position coordinates of the board 5 and the small component mask 6 in the direction X are aligned by the movement of the clamp unit 23 in the direction X, and the position coordinates of the board 5 and the small component mask 6 in the direction Y are aligned by the movement of the board working table 2*a* in the direction Y and the movement of the printing table 3*a* in the direction Y, as shown in FIG. 9. Furthermore, the mask fixing member 31 of the printing table 3*a* is rotated in the horizontal plane (X-Y plane), whereby the inclination of the board 5 and the inclination of the small component mask 6 in the horizontal plane are matched.

At step S6, the printing table 3*a* lowers the small component mask 6 and registers the small component mask 6 to the board 5 (see FIG. 4). Thus, the small component mask 6 is pressed against the board 5 by prescribed pressing force and is brought into close contact with the board 5. After the completion of the plate register, the first printing is performed by the small component mask 6 of the printing table 3*a* at step S7. In other words, solder is supplied onto the small component mask 6, and the squeegee unit 4*a* (movable beam 42) is driven (performs a scraping operation) in the direction Y in a state where the squeegee 41 is lowered and presses the board 5 through the small component mask 6, whereby solder is printed on the upper surface of the board 5 through the small component mask 6, and the squeegee 41 is raised. Due to the first printing, the solder Sd1 having the solder height H1 is formed at positions on the board 5 according to the opening pattern of the small component mask 6. After the first printing, the printing table 3*a* is raised along arrow Z1, and the small component mask 6 is released from the board 5 at step S8.

From step S9, the second printing is performed by the large component mask 7 of the printing table 3*b*. The operations are basically similar to the aforementioned operations at steps S4 to S8, and hence the description is simplified. At step S9, the mask recognition marks Q of the large component mask 7 of the printing table 3*b* are imaged (the image is recognized) by the mask recognition camera 24 of the clamp unit 23. Due to the image recognition at steps S3 and S10, the relative positional relationship between the position and posture in the horizontal direction of the board 5 held by the clamp unit 23 and the position and posture in the horizontal direction of the large component mask 7 mounted on the printing table 3*b* is acquired.

Figure 10:
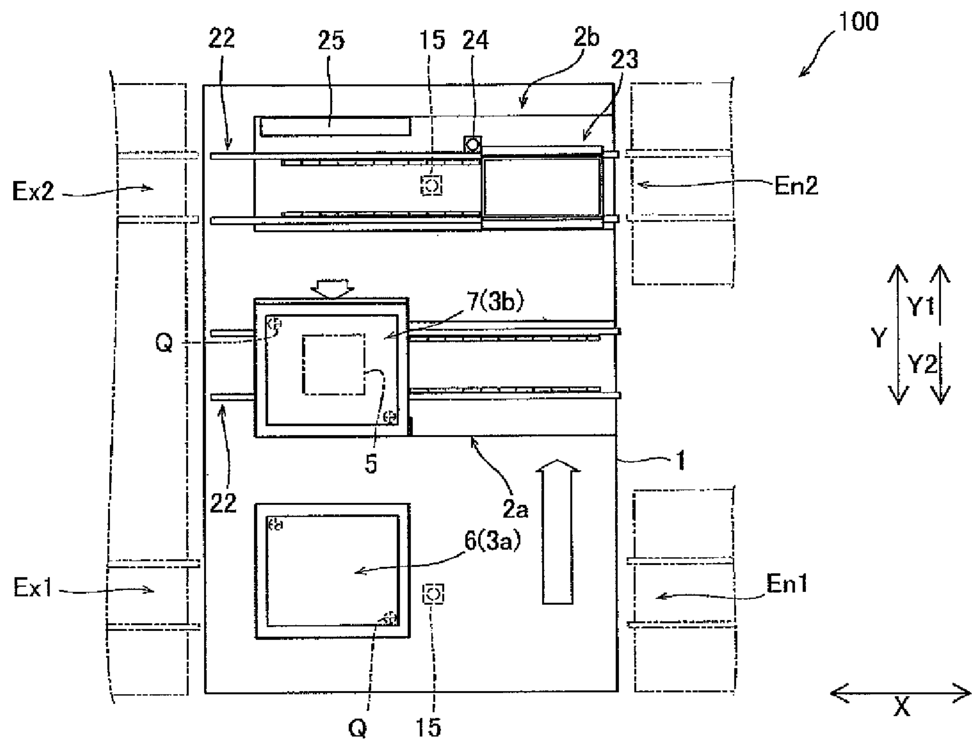
FIG. 10 is a schematic view showing the positional relationship of the printing apparatus according to the first embodiment of the present disclosure during the board printing operation (second printing).
Figure 11:
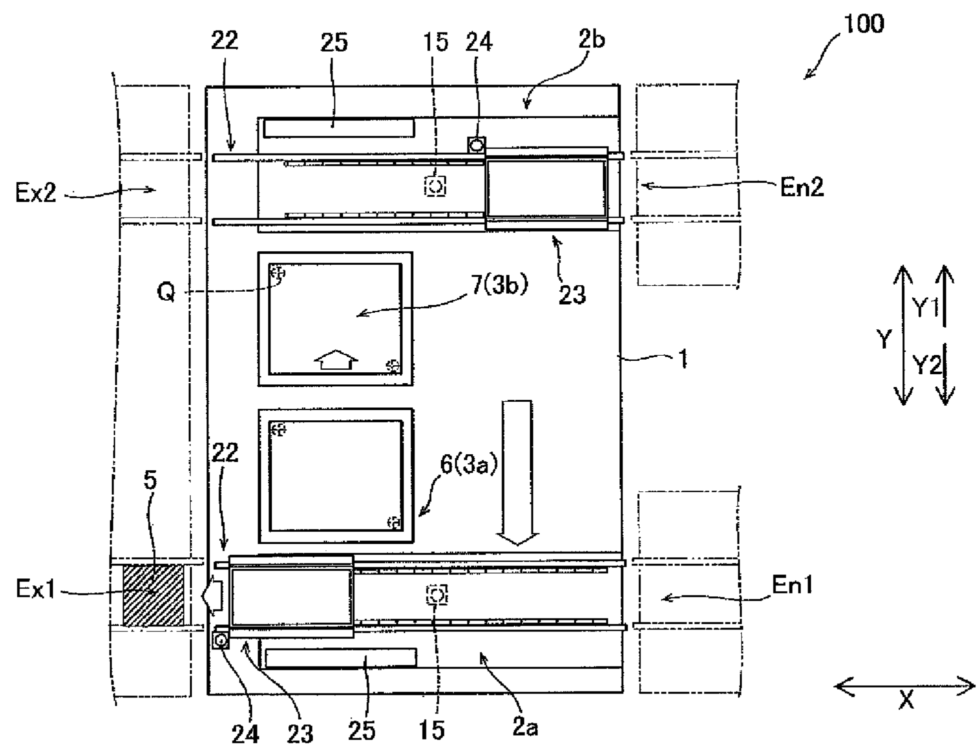
FIG. 11 is a schematic view showing the positional relationship of the printing apparatus according to the first embodiment of the present disclosure during the board printing operation (when the board is carried out of the printing apparatus).

At step S10, the board 5 held by the clamp unit 23 and the large component mask 7 held by the printing table 3*b* are moved to a printing position. In other words, on the basis of the results of the recognition at steps S3 and S10, the relative positions and postures of the board 5 and the large component mask 7 in the horizontal plane are matched by the movement of the clamp unit 23 in the direction X, the movement of the board working table 2*a* and the printing table 3*b* in the direction Y, and the rotation of the mask fixing member 31 of the printing table 3*b* are aligned by the movement of the board working table 2*a* in the direction Y and the movement of the printing table 3*a* in the direction Y, as shown in FIG. 10.

At step S11, the printing table 3*b* lowers the large component mask 7 and registers the large component mask 7 to the board 5 (see FIG. 5). After completion of the plate register, the second printing is performed by the large component mask 7 of the printing table 3*b* and the squeegee unit 4*b* at step S12. Thus, the solder Sd2 having the solder height H2 is formed at positions on the board 5 according to the opening pattern of the large component mask 7 to be added on the board 5 after the solder Sd1 is formed on the board 5 by the first printing. After the second printing, the large component mask 7 is released from the board 5 at step S13.

At step S14, clamping (fixing) of the board 5 by the clamp unit 23 is released. In other words, the board 5 is arranged on the conveying conveyor 22 by the support mechanism 53 and the clamp mechanism 52 (see FIG. 3). The board working table 2*a* moves along arrow Y2 to the carry-out position Ex1. At step S15, the printed board 5 is carried out of the board working table 2*a* (conveying conveyor 22) at the carry-out position Ex1. According to the first embodiment, as hereinabove described, the printing table 3*a* holds the small component mask 6 having the first thickness Th1 that is a prescribed thickness configured to perform the first printing of printing solder on the board 5. The printing table 3*b* holds the large component mask 7 formed with the relief portion 7*b* having the depth D larger than the first thickness Th1 on the board contact surface to relieve the solder Sd1 having the solder height H1 printed by the small component mask 6, having the second thickness Th2 that is a prescribed thickness thicker than the first thickness Th1 to perform the second printing of printing solder on the board 5 after the first printing by the printing table 3*a*. The arithmetic processing portion 81 is configured to perform the second printing by the large component mask 7 of the printing table 3*b* after the first printing by the small component mask 6 of the printing table 3*a* is performed on the board 5 held by the board working table 2*a* (2*b*). Thus, the first printing using the small component mask (very small component mask) 6 and the second printing using the large component mask 7 can be performed by the single printing apparatus 100. Thus, it is not necessary to provide two board printing apparatuses in the production line, and hence the board can be produced without complicating the structure of the production line even in the case where printing is performed using two types of masks, the small component mask 6 and the large component mask 7.

(Second Embodiment)

A printing apparatus 100*a* according to a second embodiment of the present disclosure is now described with reference to FIGS. 6, 7, and 12 to 14. In this second embodiment, an example of performing the printing preparation operation of one of printing tables 3*a* and 3*b* during the printing operation of the other of the printing tables 3*a* and 3*b* in addition to the aforementioned structure of the printing apparatus 100 according to the first embodiment is described.

An arithmetic processing portion 81*a* (see FIG. 6) of the printing apparatus 100*a* according to the second embodiment is configured to perform the printing preparation operation of one of the printing table 3*a* and the printing table 3*b* during the board printing operation of the other of the printing table 3*a* and the printing table 3*b*. The arithmetic processing portion 81*a* is an example of the "control portion" in the present disclosure.

In other words, in the board printing operation performed by the printing apparatus 100*a*, first printing by the printing table 3*a* and second printing by the printing table 3*b* are sequentially performed, so that a standby period T1 (standby processing) is generated in the printing table 3*b* during the printing operation of the printing table 3*a*, for example, as shown in FIG. 7. The printing preparation operation is performed in advance during this standby period T1, whereby the arithmetic processing portion 81*a* reduces the time required for processing (at steps S9 to S13) for the second printing by the printing table 3*b*. The board printing operation includes at least operations from the start of movement to a printing position (steps S5 and S10) to the termination of plate releasing (steps S8 and S13). The mask mark recognition at steps S4 and S9 is not necessarily performed each time when the printing operation is continuously performed. Therefore, when the mask mark recognition is performed, this mask mark recognition operation is also included in the printing operation.

Specifically, according to the second embodiment, the arithmetic processing portion 81*a* is configured to perform control (advance approach operation) of moving the printing table 3*b* closer to the printing position by moving the printing table 3*b* in a direction Y such that a distance between the printing table 3*a* and the printing table 3*b* in the direction Y is reduced during the board printing operation of the printing table 3*a*. This corresponds to performing in advance part of processing for movement to the printing position at the step S10 in FIG. 7.

Figure 12:
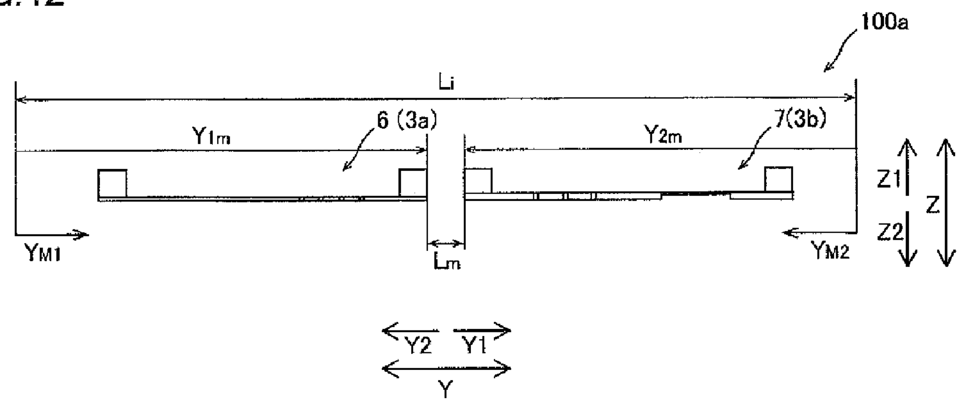
FIG. 12 is a schematic view for illustrating an advance approach operation of the printing apparatus according to the second embodiment of the present disclosure.

The advance approach operation is now described. As shown in FIG. 12, the Y-axis of the printing table 3*a* is shown by ($Y_{M1}$), and the Y-axis of the printing table 3*b* is shown by ($Y_{M2}$). As to the Y-axis coordinates, the positions of the outer ends in the direction Y in the case where the printing tables 3*a* and 3*b* are located on the outer ends of movement ranges in the direction Y are set to original points, and a direction in which the printing tables 3*a* and 3*b* come closer to each other is set to be positive. For ease of description, the position coordinates of the inner ends of the printing tables 3*a* and 3*b* in the direction Y are used as the positions of the printing tables 3*a* and 3*b*.

The distance between the printing tables 3*a* and 3*b* in a state where the printing tables 3*a* and 3*b* are closest to each other without interference is calculated from an actual measured or design value and is set to an accessible minimum interval $L_m$.

Assuming that the Y-direction coordinates of the printing table 3*a* and the printing table 3*b* are $Y_{1m}$ and $Y_{2m}$, respectively when the printing table 3*a* and the printing table 3*b* are moved such that the distance between the printing tables is the minimum interval $L_m$, a distance $L_i$ between the original points of the Y-axis can be expressed as follows:

$$L_i=L_m+Y_{1m}+Y_{2m}$$

Assuming that the current position coordinate of the printing table 3*a* during the board printing operation (first printing) is $Y_{AC}$ and the target position coordinate of the printing table 3*b* moved closer is $Y_{BN}$, the target position coordinate $Y_{BN}$ can be expressed as follows:

$$Y_{BN}=L_i-L_m-Y_{AC}$$

Thus, during the board printing operation of the printing table 3*a*, the printing table 3*b* can be moved to the closest position coordinate (target position coordinate $Y_{BN}$) without interference. According to the second embodiment, these minimum interval $L_m$ and distance $L_i$ between the original points are previously acquired and stored in a control data storage portion 82*b*. The current position coordinate $Y_{AC}$ of the printing table 3*a* is acquired from the encoder output value of a Y-axis motor 33*c* of a mask drive mechanism 33 of the printing table 3*a*.

Figure 13:
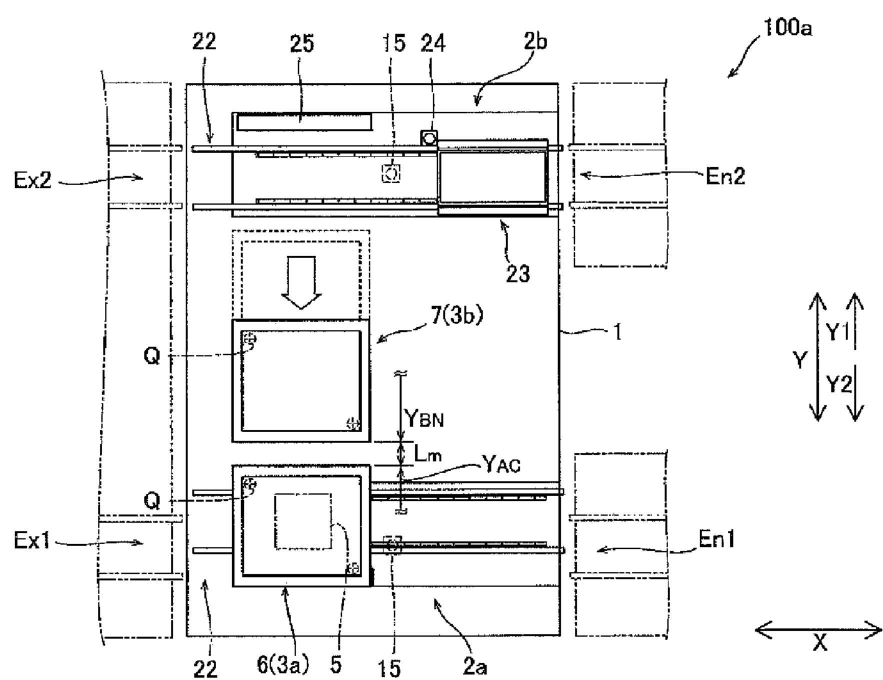
FIG. 13 is a schematic view showing the positional relationship of the printing apparatus according to the second embodiment of the present disclosure during a board printing operation (first printing).

In the printing apparatus 100*a* according to the second embodiment, the arithmetic processing portion 81*a* performs the advance approach operation of the printing table 3*b* at a prescribed time point during the steps S4 to S8 (standby period T1) in FIG. 7. Thus, during the board printing operation (first printing) of the printing table 3*a*, the printing table 3*b* is moved (approaches) along arrow Y2 to a position (target position coordinate $Y_{BN}$) where an interval between the printing table 3*a* and the printing table 3*b* is the minimum interval $L_m$, as shown in FIG. 13.

Figure 14:
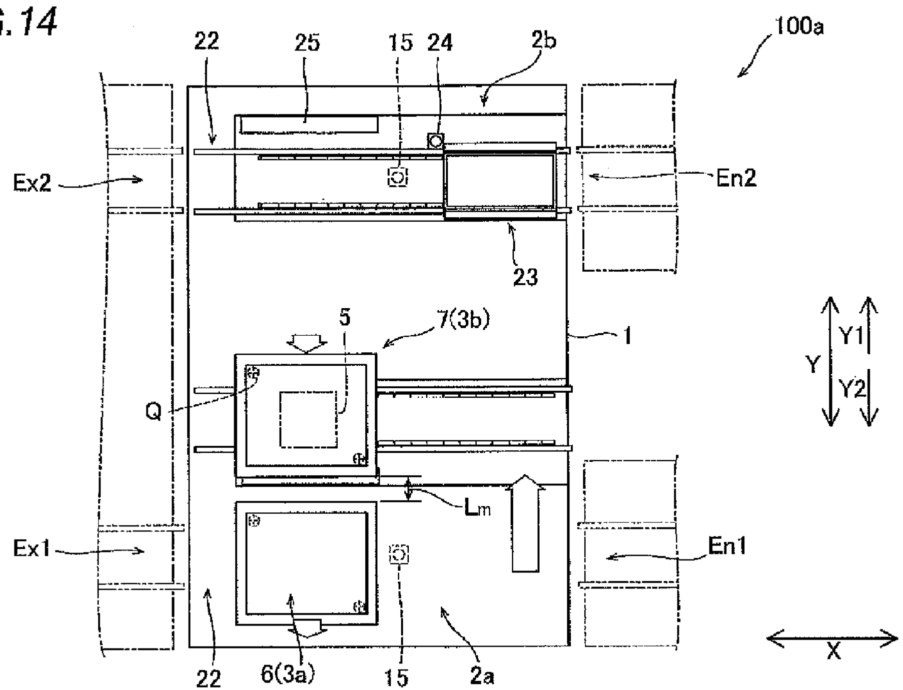
FIG. 14 is a schematic view showing the positional relationship of the printing apparatus according to the second embodiment of the present disclosure during the board printing operation (second printing).

After the shift to step S9 in FIG. 7, the printing tables 3*a* and 3*b* move along arrow Y2 while keeping a distance equal to or more than the minimum interval $L_m$ following the movement of a board working table 2*a* along arrow Y1, as shown in FIG. 14. Consequently, the time required for the movement to the printing position at the step S10 (the movement distance in the direction Y) is minimized.

The remaining structure of the printing apparatus 100*a* according to the second embodiment is similar to that of the aforementioned printing apparatus 100 according to the first embodiment, and hence the description is omitted.

According to the second embodiment, as hereinabove described, the arithmetic processing portion 81*a* performs the printing preparation operation of the printing table 3*b* during the board printing operation of the printing table 3*a*. Thus, the preparation operation for subsequent printing can be performed in advance in the printing table 3*b*, utilizing the standby period during the board printing operation (first printing) of the printing table 3*a*. Consequently, the time required for board printing (the time required for the board printing operation and the printing preparation operation) can be reduced even in the case where the first printing and the second printing are performed by the single printing apparatus 100*a*.

According to the second embodiment, as hereinabove described, the arithmetic processing portion 81*a* moves the printing table 3*b* closer to the printing position by moving the printing table 3*b* along arrow Y2 such that the distance between the printing table 3*a* and the printing table 3*b* in the direction Y is reduced during the board printing operation (first printing) of the printing table 3*a*. Thus, part of the operation of the movement of the printing table 3*b* to the printing position can be performed during the board printing operation (first printing) of the printing table 3*a*, and hence the time required for board printing (the movement time to the printing position) can be reduced when the second printing is performed by the printing table 3*b*.

According to the second embodiment, as hereinabove described, the printing table 3*b* is moved closer to the printing position until the interval between the printing tables 3*a* and 3*b* becomes the accessible minimum interval $L_m$ without interference during the board printing operation of the printing table 3*a*. Thus, the printing table 3*b* can be moved as close as possible to the printing position during the board printing operation of the printing table 3*a*, and hence the time required for board printing can be effectively reduced when the second printing is performed by the printing table 3*b*.

According to the second embodiment, as hereinabove described, the printing table 3*b* is located at the printing position by moving the printing table 3*a* and the printing table 3*b* along arrow Y2 while the distance equal to or more than the minimum interval $L_m$ is kept when the second printing is performed by the printing table 3*b* after the printing table 3*b* is moved closer to the printing position. Thus, the time required for the movement of the printing table 3*b* to the printing position can be reduced, as compared with the case where the printing table 3*a* and the printing table 3*b* are moved in order (individually).

The remaining effects of the second embodiment are similar to those of the aforementioned first embodiment.

(Third Embodiment)

A printing apparatus 100*b* according to a third embodiment of the present disclosure is now described with reference to FIGS. 6, 7, and 15. In this third embodiment, another example of performing the printing preparation operation of one of printing tables 3*a* and 3*b* during the printing operation of the other of the printing tables 3*a* and 3*b*, different from the aforementioned example of the second embodiment, is described.

An arithmetic processing portion 81*b* (see FIG. 6) of the printing apparatus 100*b* according to the third embodiment is configured to perform control (advance lowering operation) of lowering a mask fixing member 31 (large component mask 7) of the printing table 3*b* from a plate releasing height position H3 (see FIG. 15) after second printing to a standby height position H4 (see FIG. 15) lower than the plate releasing height position H3, where solder Sd1 on a board 5 is not in contact with the large component mask 7 during the board printing operation (first printing) of the printing table 3*a*. This corresponds to performing in advance part of the plate registering operation at step S11 in FIG. 7. The plate releasing height position H3 is an example of the "large component mask plate releasing height position" in the present disclosure. The arithmetic processing portion 81*b* is an example of the "control portion" in the present disclosure.

The height position of the printing table (mask) at the time of plate releasing is now described. The plate releasing height position is determined by the solder height of solder formed by printing and the amount of deflection of the mask, and a safety margin for ensuring that the mask does not contact the formed solder.

Figure 15:
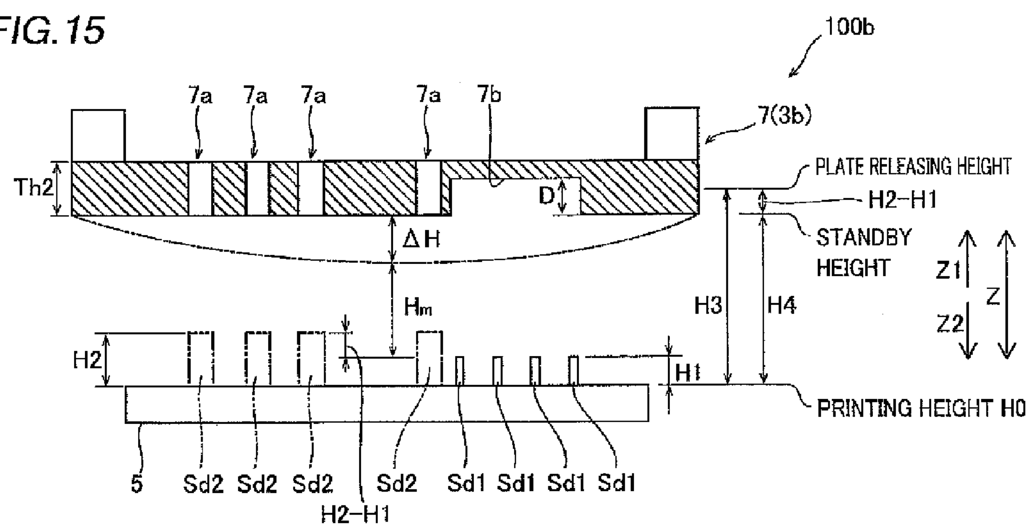
FIG. 15 is a schematic view for illustrating an advance lowering operation of the printing apparatus according to the third embodiment of the present disclosure.

In the case of the large component mask 7 (printing table 3*b*), when the solder height of solder Sd2 (the maximum height of the solder on the board 5) is H2, the amount of deflection of the large component mask 7 is ΔH, and the safety margin is $H_m$, using a printing height (height position at the time of the plate register) H0 as a reference, as shown in FIG. 15, the plate releasing height position H3 after the second printing is expressed as follows:

$$H3=H2+\Delta H+H_m$$

The solder Sd2 is not formed on the board 5 before the second printing by the large component mask 7 (printing table 3*b*), and only the solder Sd1 having a solder height H1 (i.e. the thickness Th1 of a small component mask 6) is formed. Therefore, before the second printing, the printing table 3*b* (large component mask 7) can be lowered to the standby height position H4 shown in the following expression while the solder Sd1 on the board 5 is not in contact with the large component mask 7.

$$H4=H1+\Delta H+H_m$$

In other words, before the second printing, the large component mask 7 can be lowered by a distance corresponding to a difference between the solder height H1 before the second printing and the maximum solder height H2 after the second printing.

Thus, the printing table 3*b* is lowered to the standby height position H4 where the printing table 3*b* does not interfere with the solder Sd1 on the board 5 during the board printing operation (first printing) of the printing table 3*a*.

The solder height H1 corresponds to the thickness (first thickness) Th1 of the small component mask 6, so that the solder height H1 is previously stored as part of the board data of the board 5 to be produced in a control data storage portion 82*b*. The safety margin $H_m$ is a prescribed value previously set in the control data storage portion 82*b*. The amount of deflection ΔH of the mask mainly depends on the dimension (length, width, and thickness) of the mask. Therefore, according to the third embodiment, a table associating the dimension of the mask with the amount of dimensional deflection ΔH is previously prepared and stored in the control data storage portion 82*b*. The arithmetic processing portion 81*b* is configured to acquire the amount of deflection ΔH corresponding to the dimension of the large component mask 7 registered in the board data from the control data storage portion 82*b*.

In the printing apparatus 100*b* according to the third embodiment, the arithmetic processing portion 81*b* performs the advance lowering operation of the printing table 3*b* at a prescribed time point during the steps S4 to S8 (standby period T1) in FIG. 7. Thus, during the board printing operation (first printing) of the printing table 3*a*, the large component mask 7 of the printing table 3*b* is previously lowered from the plate releasing height position H3 to the standby height position H4, as shown in FIG. 15.

When the large component mask 7 is registered to the board 5 at step S11 in FIG. 7, the printing table 3*b* (large component mask 7) is lowered from the standby height position H4 lower than the plate releasing height position H3 to the printing height H0, and the large component mask 7 is registered to the board 5. Consequently, the time required to register the large component mask 7 to the board 5 at step S11 (the movement distance in a direction Z) is minimized.

The remaining structure of the printing apparatus 100*b* according to the third embodiment is similar to that of the aforementioned printing apparatus 100 according to the first embodiment, and hence the description is omitted.

According to the third embodiment, as hereinabove described, the arithmetic processing portion 81*b* lowers the printing table 3*b* from the plate releasing height position H3 with respect to the board 5 after the second printing to the standby height position H4 lower than the plate releasing height position H3, where the solder Sd1 having the solder height H1 on the board 5 is not in contact with the large component mask 7 during the board printing operation (first printing) using the small component mask 6 of the printing table 3*a*. Thus, during the board printing operation (first printing) of the printing table 3*a*, the printing table 3*b* can perform in advance part of the lowering operation for registering the large component mask 7 to the board 5 in the printing table 3*b*. Consequently, the time required for board printing can be reduced when the second printing is performed by the printing table 3*b*.

In the case of continuous production of the board 5, after carrying the board 5 out of the conveying conveyor 22 at step S15 in FIG. 7, the arithmetic processing portion 81*b* returns to step S1 and carries a new board 5 into the conveying conveyor 22. Therefore, the advance lowering operation may be performed on a subsequent board 5 in the printing table 3*a* during a standby period T2 (steps S9 to S13) after the first printing performed on a prior board 5. In this case, no solder is formed on the board 5 before the first printing is carried into the conveying conveyor 22 (the solder height is 0), and hence the printing table 3*a* can be lowered in advance to the standby height position (not shown) corresponding to the amount of deflection ΔH+the safety margin Hm according to the dimension of the small component mask 6.

According to the third embodiment, as hereinabove described, the standby height position H4 is determined on the basis of at least the thickness Th1 (i.e. solder height H1) of the small component mask 6 and the amount of deflection ΔH of the large component mask 7. Thus, the large component mask 7 can be arranged at the standby height position H4 where the large component mask 7 is moved as close as possible to the board 5 after the first printing in consideration of the thickness Th1 corresponding to the height H1 of the solder Sd1 formed on the board 5 after the first printing and the amount of deflection ΔH of the large component mask 7 for performing the second printing. Thus, the time required for board printing can be effectively reduced when the second printing is performed by the printing table 3*b*.

The remaining effects of the third embodiment are similar to those of the aforementioned second embodiment.

(Fourth Embodiment)

A printing apparatus 100*c* according to a fourth embodiment of the present disclosure is now described with reference to FIGS. 6, 7, 12, and 16. In this fourth embodiment, another example of performing the printing preparation operation of one of printing tables 3*a* and 3*b* during the printing operation of the other of the printing tables 3*a* and 3*b*, different from the aforementioned example of the third embodiment, is described.

An arithmetic processing portion 81*c* (see FIG. 6) of the printing apparatus 100*c* according to the fourth embodiment is configured to perform control (advance mask recognition) of recognizing a large component mask 7 of the printing table 3*b* using a board working table 2*b* during the board printing operation (first printing) of a board working table 2*a* and the printing table 3*a*. This corresponds to performing in advance mask mark recognition at step S9 in FIG. 7. The arithmetic processing portion 81*c* is an example of the "control portion" in the present disclosure.

Figure 16:
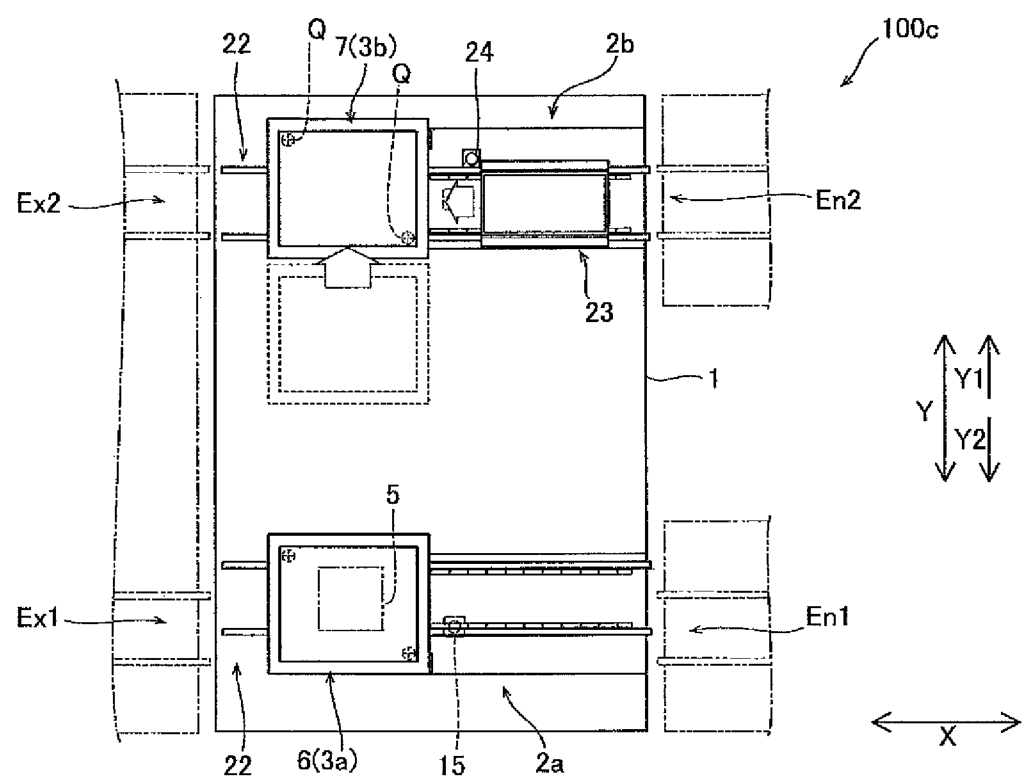
FIG. 16 is a schematic view showing the positional relationship of the printing apparatus according to the fourth embodiment of the present disclosure during a board printing operation (first printing) for illustrating advance mask recognition.

Specifically, the arithmetic processing portion 81*c* moves the printing table 3*b* along arrow Y1 during the board printing operation (first printing) of the board working table 2*a* and the printing table 3*a*, as shown in FIG. 16. Then, the arithmetic processing portion 81*c* locates a mask recognition camera 24 of a clamp unit 23 below mask recognition marks Q of the large component mask 7 of the printing table 3*b* by the movement in a direction Y of the board working table 2*b* in a standby state and the movement in a direction X of the clamp unit 23 of the board working table 2*b* and images (recognizes the image of) the mask recognition marks Q by the mask recognition camera 24. Thus, the position and posture of the large component mask 7 in a horizontal direction are recognized.

When performing the advance mask recognition, the arithmetic processing portion 81*c* performs the mask mark recognition (at the step S9) of the large component mask 7 by the mask recognition camera 24 of another board working table 2*b* in the case where second printing is performed on the board 5 held by the board working table 2*a*. Therefore, according to the fourth embodiment, the arithmetic processing portion 81*c* performs processing for adjusting the relative positions of the coordinate system (the X-axis and the $Y_{M1}$-axis (see FIG. 12)) in the horizontal direction of the mask recognition camera 24 of the board working table 2*a* and the coordinate system (the X-axis and the $Y_{M2}$-axis (see FIG. 12)) in the horizontal direction of the mask recognition camera 24 of the board working table 2*b* recognizing the large component mask 7.

Specifically, the relative positional relationship(positional displacement between both coordinates in the direction X and the direction Y) between the coordinate system of the mask recognition camera 24 of the board working table 2*a* and the coordinate system in the horizontal direction of the mask recognition camera 24 of the board working table 2*b* recognizing the large component mask 7 is previously measured, and correction parameters for converting each other's coordinate systems are prepared and stored in a control data storage portion 82*b*. Thus, the arithmetic processing portion 81*c* can convert the position coordinates of the large component mask 7 acquired with the mask recognition camera 24 of the board working table 2*b* into the coordinate system (the X-axis and the $Y_{M1}$-axis) of the mask recognition camera 24 of the board working table 2*a* with the correction parameters to use the same.

In the printing apparatus 100*c* according to the fourth embodiment, the arithmetic processing portion 81*c* performs the advance mask recognition of the printing table 3*b* at a prescribed time point during steps S4 to S8 (standby period T1) in FIG. 7. Thus, the mask mark recognition at step S9 in FIG. 7 is completed during steps S4 to S8. When step S8 is completed, therefore, the arithmetic processing portion 81*c* skips the already completed step S9 and advances to step S10. At step S10, the arithmetic processing portion 81*c* performs processing for moving the board working table 2*a* and the printing table 3*b* to a printing position by associating the horizontal position of the board 5 with the horizontal position of the large component mask 7, using the recognition result of board marks at step S3, the recognition result acquired by the advance mask recognition, and the correction parameter previously stored in the control data storage portion 82*b*.

The remaining structure of the printing apparatus 100*c* according to the fourth embodiment is similar to that of the aforementioned printing apparatus 100 according to the first embodiment, and hence the description is omitted.

According to the fourth embodiment, as hereinabove described, the arithmetic processing portion 81*c* recognizes the large component mask 7 of the printing table 3*b* using the board working table 2*b* during the board printing operation of the board working table 2*a* and the printing table 3*a* using the small component mask 6. Thus, the mask recognition for aligning the large component mask 7 with the board 5 can be performed in advance in the printing table 3*b* during the board printing operation (first printing) of the printing table 3*a* using the small component mask 6. Consequently, the arithmetic processing portion 81*c* can skip step S9 in FIG. 7 and directly perform the second printing by the large component mask 7 that has been already recognized after the first printing, and hence the time required for board printing can be reduced when the second printing is performed.

The mask recognition is required to relatively align the masks with the boards (the board working tables 2*a* and 2*b*), and hence the mask recognition must be performed at least at the time of the initial printing of the printing apparatus. On the other hand, the mask is fixed to a mask fixing member 31 of the printing table 3*a* (3*b*), so that mask recognition is not necessarily required each time the printing operation is performed. However, minute positional displacement is generated due to the thermal extension or the like of each part such as a ball screw shaft of a drive mechanism also during the operation of the apparatus, and hence the mask recognition may be regularly performed each time a certain number of boards are produced or each time a certain period of time elapses, for example.

According to the fourth embodiment, as hereinabove described, the arithmetic processing portion 81*c* recognizes the large component mask 7 using the board working table 2*b* at least when the board printing operation is first performed by the board working table 2*a* and the printing table 3*a*. Thus, at least the first mask recognition operation is performed in advance, whereby the second printing can be immediately started. If mask recognition is performed at least when the printing is first performed, the subsequent mask recognition can be skipped by utilizing the mask recognition result.

The remaining effects of the fourth embodiment are similar to those of the aforementioned second embodiment.

(Fifth Embodiment)

A printing apparatus 100*d* according to a fifth embodiment of the present disclosure is now described with reference to FIGS. 6, 7, 9, 10, 17, and 18. In this fifth embodiment, another example of performing the printing preparation operation of one of printing tables 3*a* and 3*b* during the printing operation of the other of the printing tables 3*a* and 3*b*, different from the aforementioned example of the fourth embodiment, is described.

An arithmetic processing portion 81*d* (see FIG. 6) of the printing apparatus 100*d* according to the fifth embodiment is configured to perform control (advance cleaning operation) of cleaning a small component mask 6 of the printing table 3*a* with the board working table 2*a* during the board printing operation (second printing) of a board working table 2*b* and the printing table 3*b* on a board 5 after first printing. This is not shown in FIG. 7 but corresponds to performing in advance a mask cleaning operation between board printing and subsequent board printing (after the step S15 in FIG. 7 is completed and before a subsequent board 5 is carried into the conveying conveyor 22). The arithmetic processing portion 81*d* is an example of the "control portion" in the present disclosure.

In an advance processing operation of performing the printing preparation operation of one of the printing tables 3*a* and 3*b* during the printing operation of the other of the printing tables 3*a* and 3*b*, it is necessary to arrange the board working table (2*a* or 2*b*) in a standby state not performing the board printing operation and the printing table (3*a* or 3*b*) in a standby state on the same side of the printing apparatus in the direction Y in the case where the advance processing is performed with the board working table 2*a* (2*b*) (in the case of the aforementioned fourth or fifth embodiment).

In other words, the printing preparation operation performed by allowing the board working table 2*b* and the printing table 3*b* to cooperate with each other can be performed in advance when both the board working table 2*b* and the printing table 3*b* on the Y1 side are in a standby state, as shown in FIG. 9, for example. On the other hand, when the board working table 2*b* on the Y1 side and the printing table 3*a* on the Y2 side are in a standby state, as shown in FIG. 10, the printing operation (the second printing performed by the board working table 2*a* and the printing table 3*b*) is performed between the board working table 2*b* and the printing table 3*a*, and hence the board working table 2*b* cannot be moved in the direction Y to the printing table 3*a*.

In the fifth embodiment, an example of performing the advance cleaning operation for the small component mask 6 of the printing table 3*a* with the board working table 2*a* while the board working table 2*b* and the printing table 3*b* perform in advance the board printing operation (second printing) is described as an example of performing the mask cleaning operation.

Figure 17:
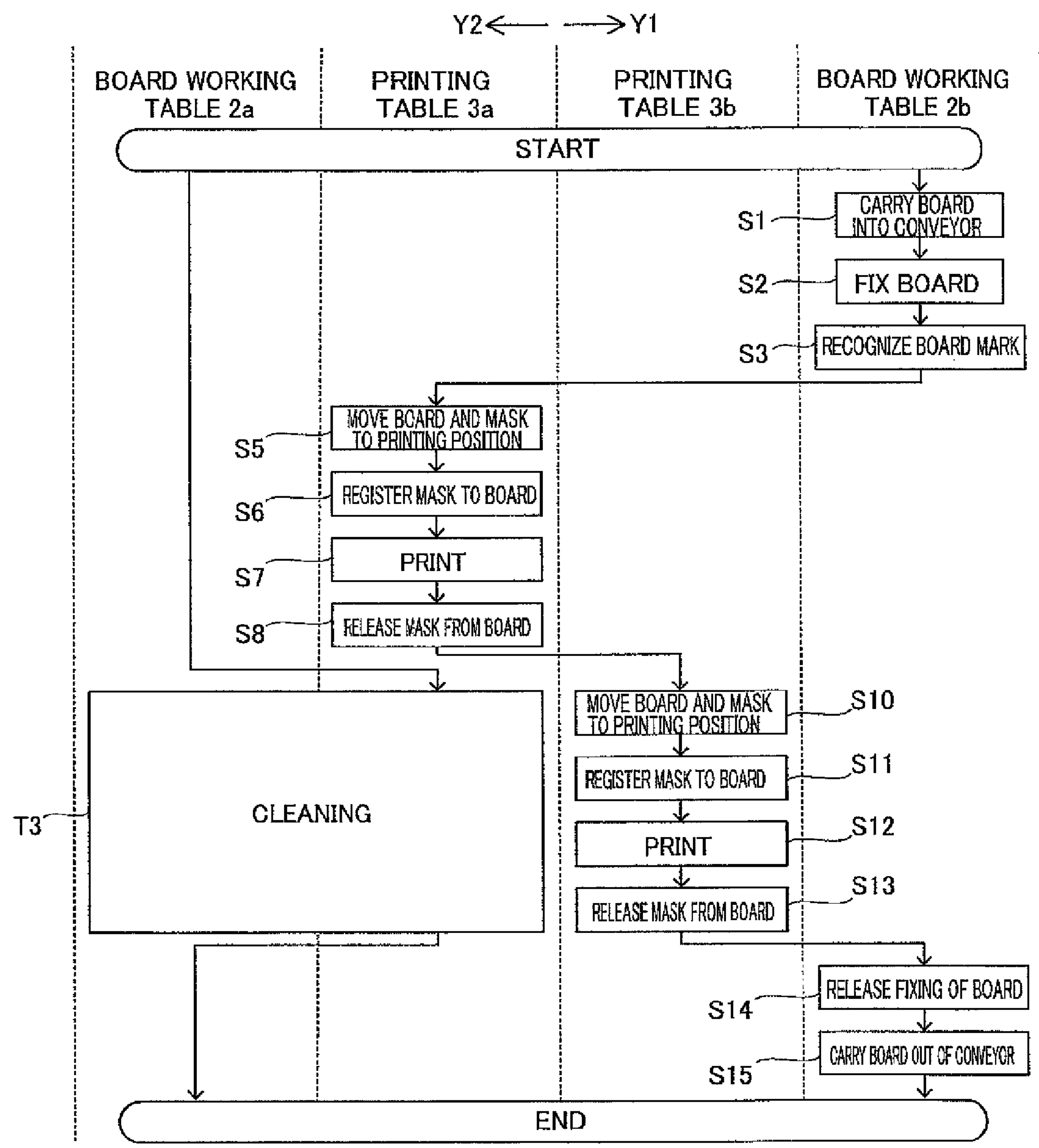
FIG. 17 is a control flowchart showing the operational outline of the printing apparatus according to the fifth embodiment of the present disclosure during a board printing operation for illustrating an advance cleaning operation.

As shown in FIG. 17, also according to the fifth embodiment, the board printing processing at steps S1 to S15 shown in FIG. 7 is performed in the board working table 2*b*. The processing flow in FIG. 17 is prepared as the middle of the printing operation continuously performed, and the mask recognition processing at steps S4 and S9 is omitted.

In the case of FIG. 17, the board working table 2*a* and the printing table 3*b* are in a standby state at steps S5 to S8 (first printing). When plate release processing at step S8 is terminated, the processing flow moves to the second printing (at steps S10 to S13) performed by the board working table 2*a* and the printing table 3*b*, and both the board working table 2*a* and the printing table 3*a* of the printing apparatus 100*d* on the Y2 side are in a standby state. Thus, the advance cleaning operation performed by allowing the board working table 2*a* and the printing table 3*a* to cooperate with each other can be performed.

Figure 18:
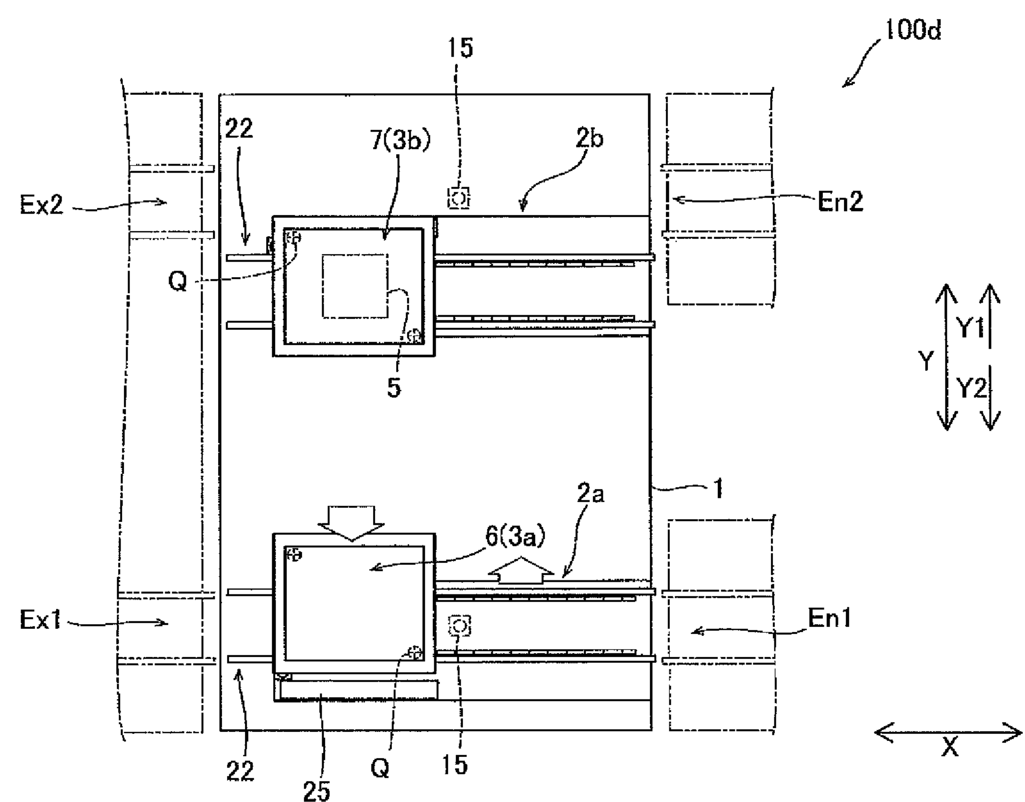
FIG. 18 is a schematic view showing the positional relationship of the printing apparatus according to the fifth embodiment of the present disclosure during the board printing operation (second printing) for illustrating the advance cleaning operation.

According to the fifth embodiment, the arithmetic processing portion 81*d* moves the printing table 3*a* along arrow Y2 in a direction separating from the printing table 3*b* during the second printing (at steps S10 to S13), as shown in FIG. 18. Then, the arithmetic processing portion 81*d* relatively moves the board working table 2*a* and the small component mask 6 (printing table 3*a*) in the direction Y while raising an unshown cleaning head of a cleaning unit 25 of the board working table 2*a* and bringing the cleaning head into contact with the board contact surface of the small component mask 6, thereby sliding the cleaning head in the direction Y with respect to the small component mask 6. At this time, the cleaning head removes solder paste by suctioning the same under negative pressure by an unshown suction nozzle. Thus, the board contact surface of the small component mask 6 is cleaned. Consequently, the mask cleaning operation generally performed between board printing and subsequent board printing is completed during steps S10 to S13. Therefore, after the completion of the board printing at step S15, the arithmetic processing portion 81*d* can skip the mask cleaning operation performed in advance and perform the printing operation of a subsequent board 5 in the printing table 3*a* (small component mask 6).

The remaining structure of the printing apparatus 100*d* according to the fifth embodiment is similar to that of the aforementioned printing apparatus 100 according to the first embodiment, and hence the description is omitted.

According to the fifth embodiment, as hereinabove described, the arithmetic processing portion 81*d* performs the mask cleaning operation for the small component mask 6 of the printing table 3*a* using the board working table 2*a* while the board working table 2*b* and the printing table 3*b* perform the board printing operation (second printing) on the board 5 after the first printing with the large component mask 7. Thus, the mask cleaning operation for the small component mask 6 can be performed in the printing table 3*a* during the board printing operation (second printing) of the printing table 3*b* after the board printing (first printing) of the printing table 3*a*. Consequently, the time required for the printing preparation operation can be reduced when the first printing is performed on the subsequent board 5 by the printing table 3*a*.

In the advance cleaning operation according to the fifth embodiment, it is simply required to arrange the board working table (2*a* or 2*b*) in a standby state and the printing table (3*a* or 3*b*) in a standby state on the same side in the direction Y, as described above, and hence the mask cleaning operation for the large component mask 7 of the printing table 3*b* may be performed using the board working table 2*b* while the board working table 2*a* and the printing table 3*a* perform the board printing operation (first printing).

According to the fifth embodiment, as hereinabove described, the arithmetic processing portion 81*d* moves the printing table 3*a* along arrow Y2 in the direction separating from the printing table 3*b* and performs the mask cleaning operation for the small component mask 6 at a position separating from the printing table 3*b* while the board working table 2*b* and the printing table 3*b* perform the board printing operation (second printing). Thus, the printing table 3*a* can be separated from the printing table 3*b* during the mask cleaning operation, and hence a work space for the mask cleaning operation can be ensured during the second printing performed by the printing table 3*b*.

The remaining effects of the fifth embodiment are similar to those of the aforementioned second embodiment.

(Sixth Embodiment)

A printing apparatus 100*e* according to a sixth embodiment of the present disclosure is now described with reference to FIGS. 6 to 10 and 19 to 23. In this sixth embodiment, an example of performing the printing operation of one of printing tables 3*a* and 3*b* during the printing operation of the other of the printing tables 3*a* and 3*b*, different from the aforementioned examples of the second to fifth embodiments in which the printing preparation operation of one of the printing tables 3*a* and 3*b* is performed during the printing operation of the other of the printing tables 3*a* and 3*b*, is described.

The printing apparatus 100*e* (see FIG. 21) according to the sixth embodiment is configured to alternately carry a board 5 into a board working table 2*a* and a board working table 2*b* and perform printing.

An arithmetic processing portion 81*e* (see FIG. 6) of the printing apparatus 100*e* according to the sixth embodiment is configured to perform control of performing a board printing operation (first printing) on a second board 5 before first printing by the printing table 3*a* and one of the board working tables 2*a* and 2*b* during a board printing operation (second printing) performed on a first board 5 after the first printing by the printing table 3*b* and the other of the board working tables 2*a* and 2*b*. The arithmetic processing portion 81*e* is an example of the "control portion" in the present disclosure.

The arithmetic processing portion 81*e* of the printing apparatus 100*e* according to the sixth embodiment is configured to perform control of carrying the board 5 into one of the board working tables 2*a* and 2*b* and carrying the board 5 out of one of the board working tables 2*a* and 2*b* during the board printing operation performed by one of the printing tables 3*a* and 3*b* and the other of the board working tables 2*a* and 2*b*.

The remaining structure of the printing apparatus 100*e* according to the sixth embodiment is similar to that of the aforementioned printing apparatus 100 according to the first embodiment, and hence the description is omitted.

Board printing operation processing performed by the printing apparatus 100*e* according to the sixth embodiment is now described with reference to FIGS. 6 to 10 and 19 to 23. The following processing is controlled by the arithmetic processing portion 81*e* of the printing apparatus 100*e*.

Figure 20:
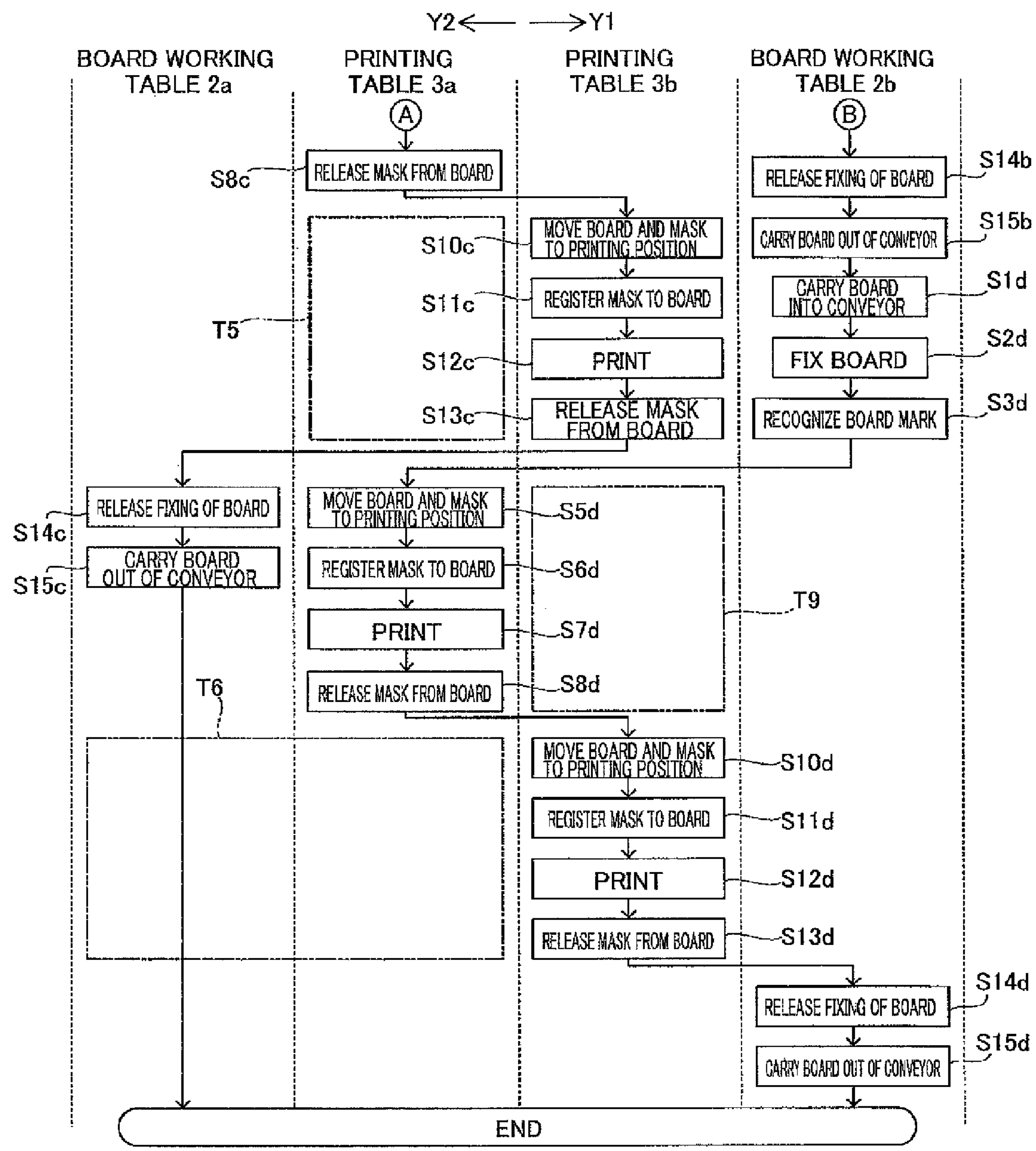
FIG. 20 is a control flowchart (second half) showing the operational outline of the printing apparatus according to the sixth embodiment of the present disclosure during the board printing operation.

In the board printing operation processing performed by the printing apparatus 100*e* according to the sixth embodiment, printing processing performed on the individual board 5 is basically similar to the processing at steps S1 to S15 in FIG. 7. As to the board 5, the number of the boards is indicated below by a, b, c, and d. The first is termed a board 5*a*, the second is termed a board 5*b*, the third is termed a board 5*c*, and the fourth is termed a board 5*d*. An example of terminating a printing operation by performing printing on the four boards 5 is shown for descriptive purposes. In FIGS. 19 and 20, the mask recognition at steps S4 and S9 in FIG. 7 is performed only at the time of initial printing, and the mask recognition is omitted at the time of printing on the subsequent boards 5 (5*b* to 5*d*). The alphabets a, b, c, and d attached to the ends of steps indicate processing on the board 5*a*, the board 5*b*, the board 5*c*, and the board 5*d*. In this example, the board 5 (5*a*) is first carried into the board working table 2*a*.

As shown in FIG. 19, first, the board 5 (5*a*) is carried into the board working table 2*a* through a carry-in position En1 (see FIG. 8) at step S1*a*. Through board fixing at step S2*a* and board mark recognition at step S3*a*, a small component mask 6 of the printing table 3*a* is recognized (only for the first time) at step S4*a*.

Next, at steps S5*a* to S8*a*, the first printing is performed on the board 5*a* by the board working table 2*a* and the printing table 3*a*. After the small component mask 6 is released from the board 5*a* at step S8*a*, a large component mask 7 of the printing table 3*b* is recognized (only for the first time) at step S9*a*.

Then, at steps S10*a* to S13*a*, the second printing (see FIG. 10) is performed on the board 5*a* by the board working table 2*a* and the printing table 3*b*. Meanwhile, in the board working table 2*b*, the board 5 (5*b*) is carried into the board working table 2*b* through a carry-in position En2 at step S1*b*, and board fixing at step S2*b* and board mark recognition (see FIG. 23) at step S1*b* are performed.

Figure 21:
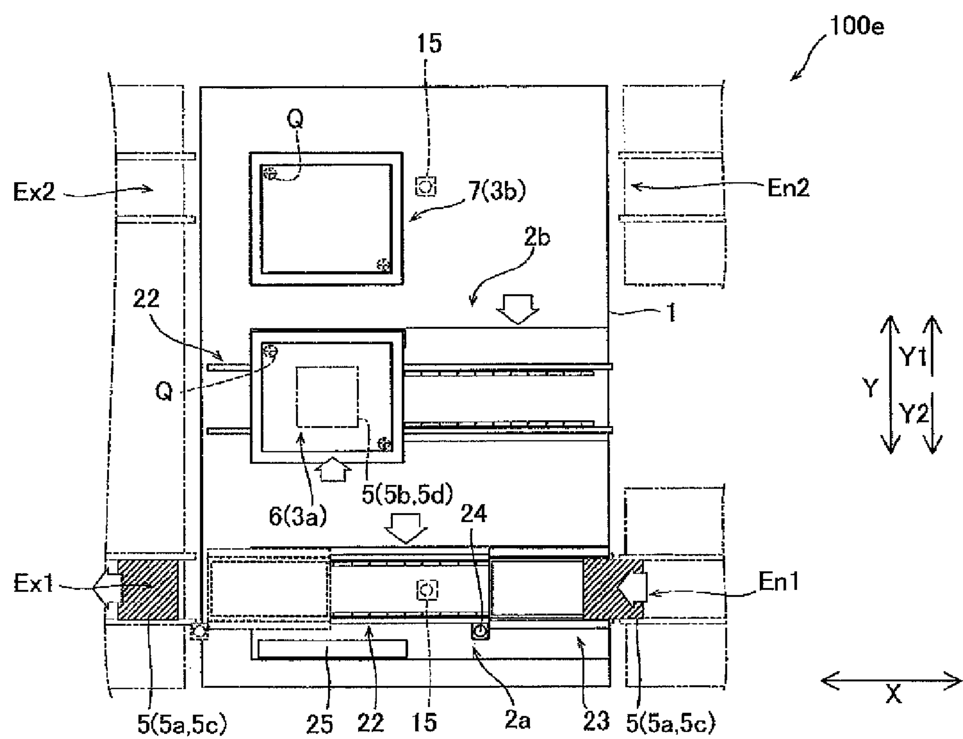
FIG. 21 is a schematic view showing the positional relationship of the printing apparatus according to the sixth embodiment of the present disclosure during the board printing operation (an operation of carrying a board into the printing apparatus, an operation of carrying the board out of the printing apparatus, and first printing).

After the large component mask 7 is released from the board 5*a* at step S13*a*, fixing of the board 5*a* on the board working table 2*a* is released, and the board working table 2*a* moves along arrow Y2 to a carry-out position Ex1 at step S14*a*. As shown in FIG. 21, the board 5*a* is carried out of the board working table 2*a* through the carry-out position Ex1 at step S15*a*, the processing advances to step S1*c* (see FIG. 19), the board 5 (5*c*) is carried into the board working table 2*a* through the carry-in position En1, and the board 5*c* is fixed at step S2*c*.

After the large component mask 7 is released from the board 5*a* at step S13*a*, the board working table 2*a* moves along arrow Y2 to the carry-out position Ex1, and hence the board working table 2*b* becomes movable along arrow Y2 to the printing table 3*a*. During steps S14*a* to S2*c*, the first printing (steps S5*b* to S8*b*) is performed on the board 5*b* by the board working table 2*b* and the printing table 3*a* in the board working table 2*b*, as shown in FIG. 21. In other words, during the board printing operation (steps S5*b* to S8*b*) performed by the board working table 2*b* and the printing table 3*a*, the board 5*a* is carried out of the board working table 2*a* (step S15*a*), and the board 5*c* is carried into the board working table 2*a* (step S1*c*).

Figure 22:
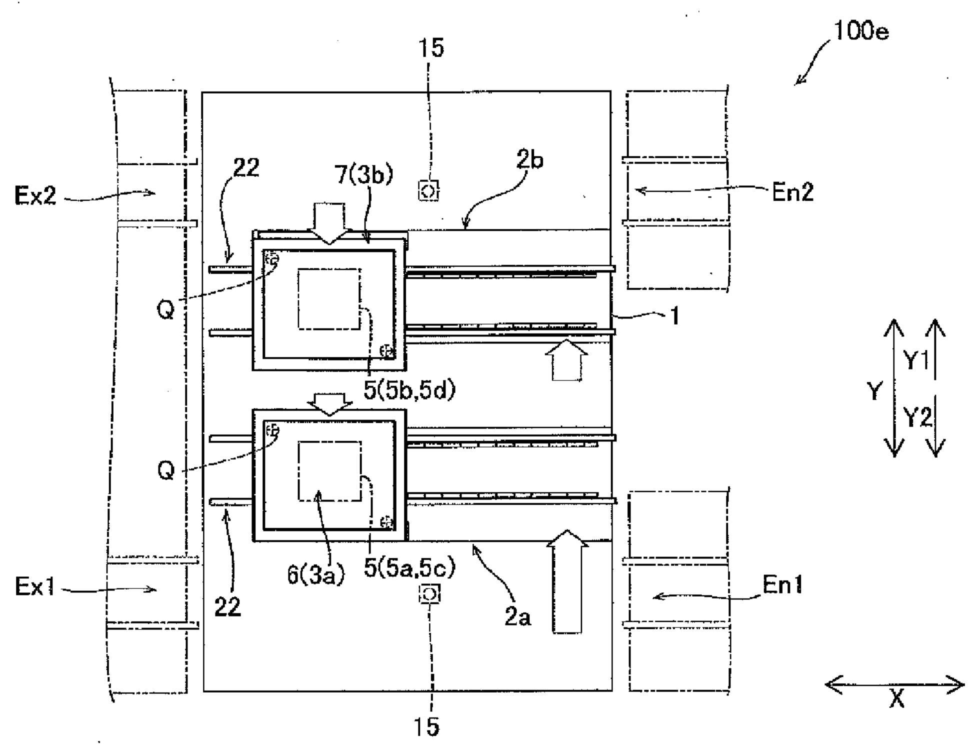
FIG. 22 is a schematic view showing the positional relationship of the printing apparatus according to the sixth embodiment of the present disclosure during the board printing operation (first printing and second printing).

After the small component mask 6 is released from the board 5*b* (step S8*b*), the second printing is performed on the board 5*b* by the board working table 2*b* and the printing table 3*b* in the board working table 2*b* at steps S10*b* to S13*b*. As shown in FIG. 22, the board working table 2*b* moves along arrow Y1 to a printing position of the second printing while the printing table 3*b* moves along arrow Y2 to the printing position of the second printing at step S10*b*, and the second printing is performed after the completion of plate register.

Meanwhile, board recognition marks of the board 5*c* are recognized (step S3*c*), and thereafter the first printing is concurrently performed on the board 5*c* by the board working table 2*a* and the printing table 3*a* at step S5*c* (movement to a printing position), step S6*c* (plate register), and step S7*c* (printing) in the board working table 2*a*. In this manner, according to the sixth embodiment, the board printing operation (first printing) (steps S5*c* to S7*c*) is performed on the board 5*c* by the printing table 3*a* and the board working table 2*a* during the board printing operation (second printing) performed on the board 5*b* by the printing table 3*b* and the board working table 2*b* at steps S10*b* to S13*b*.

Figure 23:
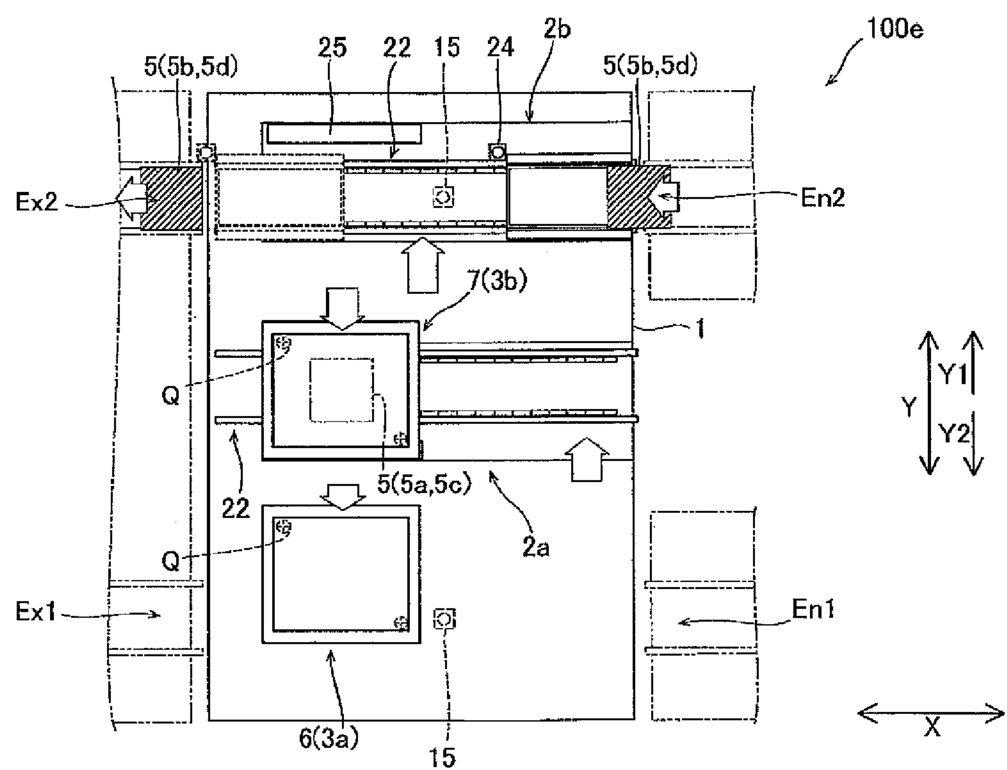
FIG. 23 is a schematic view showing the positional relationship of the printing apparatus according to the sixth embodiment of the present disclosure during the board printing operation (an operation of carrying a board into the printing apparatus, an operation of carrying the board out of the printing apparatus, and second printing).

After the large component mask 7 is released from the board 5*b* at the step S13*b*, the board working table 2*b* moves from the position shown in FIG. 22 to a carry-out position Ex2 along arrow Y1, and fixing of the board 5*b* is released (step S14*b*). Consequently, the board working table 2*a* becomes movable along arrow Y1 to the printing table 3*b*. In the board working table 2*a*, the small component mask 6 is released from the board 5*c* at a step S8*c*, and thereafter the second printing (steps S10*c* to S13*c*) is performed on the board 5*c* by the board working table 2*a* and the printing table 3*b*, as shown in FIG. 20. As shown in FIG. 23, in parallel with this second printing (steps S10*c* to S13*c*), the board 5*b* is carried out of the board working table 2*b* through the carry-out position Ex2 (step S15*b*), the board 5*d* is carried into the board working table 2*b* through the carry-in position En2 (step S1*d*), the board 5*d* is fixed (step S2*d*), and board recognition marks of the board 5*d* are recognized (step S3*d*) in the board working table 2*b*.

After the large component mask 7 is released from the board 5*c* (step S13*c*) in the board working table 2*a*, the board working table 2*a* moves from the position shown in FIG. 23 to the carry-out position Ex1 along arrow Y2, and fixing of the board 5*c* is released (step S14*c*). Then, the board 5*c* is carried out of the board working table 2*a* at the carry-out position Ex1 (step S15*c*), as shown in FIG. 21. Thus, the printing processing in the board working table 2*a* is terminated, and the board working table 2*a* is put in a standby state at the carry-out position Ex1 (carry-in position En1).

On the other hand, the board working table 2*b* moves along arrow Y2 to the printing position of the printing table 3*a* at step S4*d*, following the movement of the board working table 2*a* along arrow Y2 (step S14*c*). Then, the first printing is performed on the board 5*d* by the board working table 2*b* and the printing table 3*a* at steps S5*d* to S8*d* while the board 5*c* is carried out of the board working table 2*a* (step S15*c*), as shown in FIG. 21. Then, the second printing is performed on the board 5*d* by the board working table 2*b* and the printing table 3*b* at steps S10*d* to S13*d*. Thereafter, fixing of the board 5*d* is released at step S14*d*, the board working table 2*b* moves along arrow Y1 to the carry-out position Ex2, and the board 5*d* is carried out of the board working table 2*b* through the carry-out position Ex2 at step S15*d*. Thus, the printing processing in the board working table 2*b* is terminated, the board working table 2*b* is put in a standby state at the carry-out position Ex2 (carry-in position En2), and the printing operation of the printing apparatus 100*e* is terminated.

According to the sixth embodiment, as hereinabove described, the arithmetic processing portion 81*e* performs the board printing operation (steps S5*c* to S8*c*) of the first printing on the board 5 (5*c*) before the first printing by the printing table 3*a* and the board working table 2*a* during the board printing operation (steps S10*b* to S13*b*) of the second printing performed on the board 5 (5*b*) after the first printing by the printing table 3*b* and the board working table 2*b*. Thus, during the second printing performed on the board 5*b* (first board), the first printing can be performed in advance on the board 5*c* (second board) to be printed on next. Consequently, the time required for the board printing operation can be reduced when printing is performed on the subsequent board 5*c* even in the case where the first printing and the second printing are performed by the single printing apparatus 100*e*.

According to the sixth embodiment, as hereinabove described, the arithmetic processing portion 81*e* carries the board 5 into one of the board working tables 2*a* and 2*b* (steps S1*b*, S1*c*, and S1*d*) and carries the board 5 out of one of the board working tables 2*a* and 2*b* (steps S15*a*, S15*b*, and S15*c*) during the board printing operation performed by one of the printing tables 3*a* and 3*b* and the other of the board working tables 2*a* and 2*b*. Thus, the board 5 can be carried into and carried out of one of the board working tables 2*a* and 2*b* for the subsequent board printing during the board printing operation performed by the other of the board working tables 2*a* and 2*b*. Consequently, the time required for the printing preparation operation (the operation of carrying the board into the board working table and the operation of carrying the board out of the board working table) can be reduced when printing is performed on the subsequent board 5 even in the case where the first printing and the second printing are performed by the single printing apparatus 100*e*.

The remaining effects of the sixth embodiment are similar to those of the aforementioned second embodiment.

(Modification of Sixth Embodiment)

While the arithmetic processing portion 81*e* is configured to perform control of performing the first printing and the second printing on the different boards 5 concurrently and control of carrying another board into and out of the board working table concurrently with the board printing operation in the aforementioned sixth embodiment, in addition to this, the control shown in the aforementioned second to fifth embodiments may be performed concurrently.

Specifically, in the flowcharts shown in FIGS. 19 and 20, standby periods T4, T5, and T6 and standby periods T7, T8, and T9 exist in the operation of the printing table 3*a* and the operation of the printing table 3*b*, respectively. Therefore, the printing preparation operations can be performed in advance during these standby periods.

For example, in the printing table 3*a*, the advance approach operation shown in the aforementioned second embodiment and the advance lowering operation shown in the aforementioned third embodiment can be performed for the first printing during the standby periods T4 and T5. If the advance approach operation and the advance lowering operation are performed during the standby period T4, the time required for the processing for movement to the printing position at the step S5*b* immediately after the standby period T4 and the processing for plate register at step S6*b* can be reduced. Similarly in the printing table 3*b*, the advance approach operation and the advance lowering operation can be performed for the second printing during the standby periods T7, T8, and T9.

During the standby period T7, the board working table 2*b* located on the same side (Y1 side) as the printing table 3*b* in the direction Y as well as the printing table 3*b* are put in a standby state. Therefore, during the standby period T7, the advance mask recognition shown in the aforementioned fourth embodiment can be performed. In this case, the mask mark recognition performed by the board working table 2*a* at step S9*a* is performed in advance during the standby period T7 in which the mask mark recognition (step S4*a*) and the first printing (steps S5*a* to S8*a*) are performed in the printing table 3*a*. Consequently, step S9*a* can be skipped. During the standby period T6, the board working table 2*a* located on the same side (Y2 side) as the printing table 3*a* in the direction Y as well as the printing table 3*a* are put in a standby state after the termination of board printing. Therefore, during the standby period T6, the advance cleaning operation shown in the aforementioned fifth embodiment can be performed. Thus, during the second printing (steps S10*d* to S13*d*) performed by the printing table 3*b* and the board working table 2*b*, the mask cleaning operation for starting printing on the subsequent board 5 can be carried forward.

The embodiments disclosed this time must be considered as illustrative in all points and not restrictive. The range of the present disclosure is shown not by the above description of the embodiments but by the scope of claims for patent, and all modifications within the meaning and range equivalent to the scope of claims for patent are further included.

For example, while the present disclosure is applied to the printing apparatus (100, 100*a*, 100*b*, 100*c*, 100*d*, or 100*e*) performing solder printing on the printed board as the example of the board printing apparatus according to the present disclosure in each of the aforementioned first to sixth embodiments, the present disclosure is not restricted to this. The present disclosure may alternatively be applied to a printing apparatus of a viscous material (conductive paste such as silver paste, for example) other than solder, so far as the printing apparatus is a board printing apparatus performing board printing with screen masks.

While the two board working tables are provided in each of the aforementioned first to sixth embodiments, the present disclosure is not restricted to this. According to the present disclosure, one or three or more board working tables may alternatively be provided.

While the two board working tables and the two printing tables are movable in the direction Y in each of the aforementioned first to sixth embodiments, the present disclosure is not restricted to this. According to the present disclosure, at least either the two board working tables or the two printing tables may alternatively be movable in the direction Y for the first printing and the second printing. Thus, the board working tables may be fixed in the direction Y, and only the printing tables may be movable in the direction Y. Alternatively, the printing tables may be fixed in the direction Y, and only the board working tables may be movable in the direction Y. Alternatively, one of the board working tables may be movable in the direction Y, and the other of the board working tables may be fixed in the direction Y, for example.

While the plate register and the plate releasing are performed by moving the two printing tables vertically (in the direction Z) in each of the aforementioned first to sixth embodiments, the present disclosure is not restricted to this. According to the present disclosure, at least either the two board working tables or the two printing tables may alternatively be configured to be movable vertically for the first printing and the second printing. Thus, the board working tables may be fixed in the direction Z, and only the printing tables may be movable in the direction Z. Alternatively, the printing tables may be fixed in the direction Z, and only the board working tables may be movable in the direction Z.

While the two carry-in positions En1 and En2 are provided in each of the aforementioned first to sixth embodiments, the present disclosure is not restricted to this. One or three or more carry-in positions may alternatively be provided.

While the two carry-out positions Ex1 and Ex2 are provided in each of the aforementioned first to sixth embodiments, the present disclosure is not restricted to this. One or three or more carry-out positions may alternatively be provided.

While the board is directly delivered from the loaders provided at the carry-in positions En1 and En2 to the board working tables in each of the aforementioned first to sixth embodiments, the present disclosure is not restricted to this. According to the present disclosure, intermediate conveyors may alternatively be provided between the loaders and the board working tables, and the board may alternatively be conveyed from the loaders to the board working tables through the intermediate conveyors, for example. Particularly in the case where only one carry-in position is provided, a movable intermediate conveyor capable of distributing and conveying the board to the two board working tables may be provided.

While the mask recognition camera and the cleaning unit are provided in each of the board working tables in each of the aforementioned first to sixth embodiments, the present disclosure is not restricted to this. According to the present disclosure, no mask recognition camera may be provided in each of the board working tables, or no cleaning unit may be provided in each of the board working tables.

What is claimed is:

1. A board printing method of a board printing apparatus including a first printing table and a second printing table each configured to print a viscous material on a plurality of boards, the method comprising steps of:

performing first printing on a first board of the plurality of boards held by a first board working table by a small component mask of the first printing table;

performing second printing on a second board of the plurality of boards held by the second board working table by a large component mask of the second printing table; and after the first printing, moving the first board working table in a first direction in the horizontal direction and moving the second printing table in a second direction in the horizontal direction opposite the first direction to thereby align position coordinates of the first board working table and the second printing table and align position coordinates of the first board and the large component mask of the second printing table, wherein a board printing operation of the first printing on the first board is performed during performance of a board printing operation of the second printing on the second board, and the movement of the second printing table in the second direction occurs during performance of a board printing operation of the first printing table.

2. The board printing method according to claim 1, further comprising a step of performing a printing preparation operation performed for one of the step of performing the first printing by the first printing table and the step of performing the second printing by the second printing table during a board printing operation of the other of the step of performing the first printing by the first printing table and the step of performing the second printing by the second printing table.

3. The board printing method according to claim 1, further comprising a step of at least one of:

moving the second printing table closer to a printing position during a board printing operation of the first printing table, lowering the second printing table from a large component mask plate releasing height position to a standby height position; and performing mask recognition of the large component mask of the second printing table using a mask recognition camera during a board printing operation performed by the first printing table using the small component mask.

* * * * *